(12) United States Patent
Horikoshi

(10) Patent No.: US 12,527,107 B2
(45) Date of Patent: Jan. 13, 2026

(54) PHOTOELECTRIC CONVERSION ELEMENT, SOLID-STATE IMAGING APPARATUS, AND ELECTRONIC DEVICE

(71) Applicant: SONY SEMICONDUCTOR SOLUTIONS CORPORATION, Kanagawa (JP)

(72) Inventor: Hiroshi Horikoshi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 684 days.

(21) Appl. No.: 17/416,371

(22) PCT Filed: Nov. 28, 2019

(86) PCT No.: PCT/JP2019/046513
§ 371 (c)(1),
(2) Date: Jun. 18, 2021

(87) PCT Pub. No.: WO2020/137334
PCT Pub. Date: Jul. 2, 2020

(65) Prior Publication Data
US 2022/0077215 A1 Mar. 10, 2022

(30) Foreign Application Priority Data

Dec. 26, 2018 (JP) ................. 2018-242768

(51) Int. Cl.
*H10F 39/00* (2025.01)
*H10F 39/18* (2025.01)

(52) U.S. Cl.
CPC ......... *H10F 39/809* (2025.01); *H10F 39/018* (2025.01); *H10F 39/182* (2025.01);
(Continued)

(58) Field of Classification Search
CPC ................. H01L 27/144; H01L 27/146; H01L 27/14638; H01L 27/14601; H01L 27/1464;
(Continued)

(56) References Cited

U.S. PATENT DOCUMENTS

| 2011/0042552 A1 | 2/2011 | Furuya et al. |
| 2011/0049336 A1 | 3/2011 | Matsunuma |

(Continued)

FOREIGN PATENT DOCUMENTS

| CN | 101123670 A | 2/2008 |
| CN | 101998070 A | 3/2011 |

(Continued)

OTHER PUBLICATIONS

International Search Report and Written Opinion of PCT Application No. PCT/JP2019/046513, issued on Feb. 18, 2020, 13 pages of ISRWO.

*Primary Examiner* — Julio J Maldonado
*Assistant Examiner* — Stanetta D Isaac
(74) *Attorney, Agent, or Firm* — CHIP LAW GROUP

(57) ABSTRACT

To provide a photoelectric conversion element which enables an occupied area to be reduced and conversion efficiency and a dynamic range to be adjusted. The photoelectric conversion element includes: a photoelectric conversion unit configured to convert a light signal into a signal charge; a transfer gate structure which is connected to the photoelectric conversion unit and which is configured to transfer the signal charge; a charge storage region to which the signal charge is transferred by the transfer gate structure; a charge holding unit with a capacitor structure which is electrically connected to the charge storage region and which is configured to store the signal charge; and an amplifying transistor of which a control electrode is elec- (Continued)

trically connected to the charge storage region. The photoelectric conversion unit, the transfer gate structure, and the charge storage region are provided on a first substrate, the amplifying transistor is provided on a second substrate, and the first substrate and the second substrate are laminated.

8 Claims, 35 Drawing Sheets

(52) U.S. Cl.
CPC ..... *H10F 39/8053* (2025.01); *H10F 39/8063* (2025.01); *H10F 39/807* (2025.01)

(58) Field of Classification Search
CPC ....... H01L 27/14641; H01L 27/146643; H01L 27/14609; H01L 27/14212; H01L 27/14614; H01L 27/14636; H10F 39/809; H10F 39/018; H10F 39/182; H10F 39/8053; H10F 39/8063; H10F 39/807; H10F 39/811; H10F 39/199; H10F 39/80373; H10F 39/802; H10F 30/20
See application file for complete search history.

(56) References Cited

U.S. PATENT DOCUMENTS

| | | |
|---|---|---|
| 2011/0155893 A1 | 6/2011 | Endo |
| 2015/0084098 A1 | 3/2015 | Choi et al. |
| 2015/0129943 A1* | 5/2015 | Kato ................. H01L 27/14612 257/292 |
| 2017/0287958 A1 | 10/2017 | Ohri |
| 2018/0033809 A1 | 2/2018 | Tayanaka et al. |
| 2018/0158860 A1 | 6/2018 | Roy |
| 2018/0308895 A1 | 10/2018 | Kim et al. |
| 2019/0122918 A1 | 4/2019 | Mizuta |
| 2019/0288021 A1* | 9/2019 | Koyanagi ......... H01L 27/14641 |

FOREIGN PATENT DOCUMENTS

| | | |
|---|---|---|
| CN | 102005460 A | 4/2011 |
| CN | 104519285 A | 4/2015 |
| CN | 105474394 A | 4/2016 |
| CN | 107431075 A | 12/2017 |
| CN | 206907769 U | 1/2018 |
| CN | 108133943 A | 6/2018 |
| CN | 108886048 A | 11/2018 |
| CN | 110100312 A | 8/2019 |
| JP | 2000165754 A | 6/2000 |
| JP | 2007-228460 A | 9/2007 |
| JP | 2010114275 A | 5/2010 |
| JP | 2010-245506 A | 10/2010 |
| JP | 2011-044489 A | 3/2011 |
| JP | 2011-049445 A | 3/2011 |
| JP | 2012-019228 A | 1/2012 |
| JP | 2015-070272 A | 4/2015 |
| JP | 2016-066766 A | 4/2016 |
| JP | 2018129374 A | 8/2018 |
| JP | 2018-148116 A | 9/2018 |
| KR | 10-2011-0023758 A | 3/2011 |
| KR | 10-1377063 B1 | 3/2014 |
| KR | 10-2018-0118927 A | 11/2018 |
| KR | 10-2019-0119029 A | 10/2019 |
| TW | 200803484 A | 1/2008 |
| TW | 201133807 A | 10/2011 |
| TW | 201133809 A | 10/2011 |
| TW | 201843825 A | 12/2018 |
| WO | 2007/105478 A1 | 9/2007 |
| WO | 2016/047474 A1 | 3/2016 |
| WO | 2016/136486 A1 | 9/2016 |
| WO | 2017/169882 A1 | 10/2017 |
| WO | 2018/163838 A1 | 9/2018 |

* cited by examiner

PHOTOELECTRIC CONVERSION ELEMENT, SOLID-STATE IMAGING APPARATUS, AND ELECTRONIC DEVICE

CROSS REFERENCE TO RELATED APPLICATIONS

This application is a U.S. National Phase of International Patent Application No. PCT/JP2019/046513 filed Nov. 28, 2019, which claims priority benefit of Japanese Patent Application No. JP 2018-242768 filed in the Japan Patent Office on Dec. 26, 2018. Each of the above-referenced applications is hereby incorporated herein by reference in its entirety.

TECHNICAL FIELD

The present disclosure relates to a photoelectric conversion element, a solid-state imaging apparatus, and an electronic device and, particularly, to a backside illumination-type photoelectric conversion element that uses a CMOS, a solid-state imaging apparatus in which the photoelectric conversion element is arranged as a pixel, and an electronic device using the solid-state imaging apparatus.

BACKGROUND ART

A CMOS image sensor (CIS) that is a solid-state imaging apparatus is constituted by a pixel array in which a plurality of pixels are arranged and a logic circuit which is arranged in a periphery of the pixel array and which performs signal processing. Each pixel constituting the pixel array includes a light-receiving unit made of a photodiode (PD) and an active element (hereinafter, referred to as a "pixel transistor") such as an amplifying transistor which is arranged adjacent to the PD in the pixel. With reductions in cell size, respective functional units such as the pixel array and the logic circuit are being downsized. So-called miniaturization of a semiconductor apparatus enables the pixel transistor, the logic circuit, and the like to be reduced to a certain degree.

However, with respect to the light-receiving unit, miniaturization of an area (or a volume) for capturing light results in significantly impairing characteristics of the solid-state imaging apparatus. From such a point of view, miniaturization of a pixel size in a pixel array is being promoted so as to secure as large a size of the PD as possible while reducing the pixel transistor and the like which are arranged in the pixel. Other functional elements which are difficult to miniaturize in a similar manner to the PD include the amplifying transistor which is arranged in the pixel. With the amplifying transistor, size miniaturization similarly has a trade-off relationship with noise reduction. As described above, the miniaturization of a pixel size poses a major obstacle to the two-dimensional arrangement of the respective functional units.

In order to solve such problems, a laminated structure has recently been proposed which is divided into a semiconductor substrate that integrates a PD, a pixel transistor, and the like and a semiconductor substrate that integrates a logic circuit and which laminates the two semiconductor substrates (refer to PTL 1). In PTL 1, a backside illumination-type solid-state imaging apparatus is constructed by bonding a semiconductor substrate on which a pixel region is formed and a semiconductor substrate on which a logic circuit is formed to each other.

By laminating semiconductor substrates in this manner, functional units to be formed in a semiconductor region of the semiconductor substrates can be formed in area regions that are approximately twice as large as conventional area regions. The expansion of the semiconductor region increases a region for mounting other functions.

Effective utilization of the semiconductor region contributes toward expanding applications of a solid-state imaging apparatus and facilitates advancement of essential techniques for advancing technology related to solid-state imaging apparatuses.

CITATION LIST

Patent Literature

[PTL 1]
JP 2010-245506 A

SUMMARY

Technical Problem

The present disclosure has been made in order to solve such problems that exist in conventional art and an object thereof is to provide a photoelectric conversion element which enables an occupied area to be reduced and conversion efficiency and a dynamic range to be adjusted, a high-resolution solid-state imaging apparatus in which the photoelectric conversion element is arranged as a pixel and which effectively utilize area resources of a semiconductor substrate, and an electronic device which uses the solid-state imaging apparatus.

Solution to Problem

A first aspect of the present disclosure is a photoelectric conversion element, including: a photoelectric conversion unit configured to convert a light signal into a signal charge; a transfer gate structure which is connected to the photoelectric conversion unit and which is configured to transfer the signal charge; a charge storage region to which the signal charge is transferred by the transfer gate structure; a charge holding unit which is electrically connected to the charge storage region and which is configured to store the signal charge; and an amplifying transistor of which a control electrode is electrically connected to the charge storage region, wherein the photoelectric conversion unit, the transfer gate structure, and the charge storage region are provided on a first substrate, the amplifying transistor is provided on a second substrate, and the first substrate and the second substrate are laminated.

A second aspect of the present disclosure is a solid-state imaging apparatus in which pixels are arranged in plurality, each pixel including: a photoelectric conversion unit configured to convert a light signal into a signal charge; a transfer gate structure which is connected to the photoelectric conversion unit and which is configured to transfer the signal charge; a charge storage region to which the signal charge is transferred by the transfer gate structure; a charge holding unit which is electrically connected to the charge storage region and which is configured to store the signal charge; and an amplifying transistor of which a control electrode is electrically connected to the charge storage region, wherein the photoelectric conversion unit, the transfer gate structure, and the charge storage region are provided on a first substrate, the amplifying transistor is provided on a second substrate, and the first substrate and the second substrate are laminated.

A third aspect of the present disclosure is an electronic device including a solid-state imaging apparatus in which pixels are arranged in plurality, each pixel including: a photoelectric conversion unit configured to convert a light signal into a signal charge; a transfer gate structure which is connected to the photoelectric conversion unit and which is configured to transfer the signal charge; a charge storage region to which the signal charge is transferred by the transfer gate structure; a charge holding unit which is electrically connected to the charge storage region and which is configured to store the signal charge; and an amplifying transistor of which a control electrode is electrically connected to the charge storage region, wherein the photoelectric conversion unit, the transfer gate structure, and the charge storage region are provided on a first substrate, the amplifying transistor is provided on a second substrate, and the first substrate and the second substrate are laminated.

DESCRIPTION OF EMBODIMENTS

In the description of the drawings to be used to explain the first and second embodiments of the present disclosure, same or similar portions are denoted by same or similar reference signs and overlapping descriptions will be omitted. However, it should be noted that the drawings are schematic and relationships between thicknesses and plan view dimensions, ratios of thicknesses of respective layers, and the like may differ from those in reality. In addition, the drawings may include portions where dimensional relationships and ratios differ among the drawings. Furthermore, the embodiments presented below merely exemplify apparatuses and methods for implementing the technical ideas of the present invention and, as such, the technical ideas of the present invention are not intended to limit materials, shapes, arrangements, and the like of components to those described below.

In addition, it is to be understood that definitions of directions such as up-down with respect to a photoelectric conversion substrate and the like in the following description of the first and second embodiments are merely selected for the sake of brevity and are not intended to limit the technical ideas of the present invention. For example, it is obvious that when an object is observed after being rotated by 90 degrees, up-down is converted into and interpreted as left-right, and when an object is observed after being rotated by 180 degrees, up-down is interpreted as being inverted. Furthermore, cases where the first conduction type is a p-type and the second conduction type is an n-type will be illustratively described below. However, conduction types may be selected in a reverse relationship so that the n-type is adopted as the first conduction type and the p-type is adopted as the second conduction type. In addition, + and – that are added to p and n respectively signify a semiconductor region with a higher or lower impurity density relative to semiconductor regions to which + and – have not been added. However, the fact that p is added to semiconductor regions in a similar manner does not mean that the impurity densities of the semiconductor regions are exactly the same.

First Embodiment

<Configuration of Solid-State Imaging Apparatus>

Figure 1:
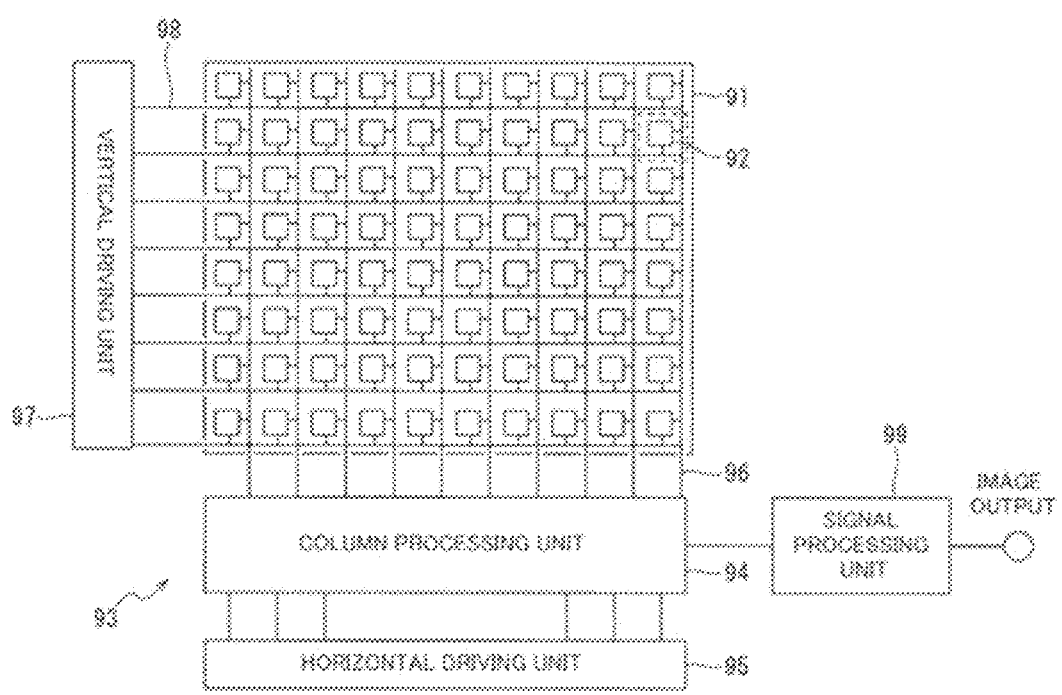
FIG. 1 is a schematic diagram for explaining a configuration of a CMOS image sensor as a solid-state imaging element to which the present disclosure is applied.

As shown in FIG. 1, a solid-state imaging apparatus includes a pixel array unit 91 and a driving unit 93 that drives the pixel array unit 91. The driving unit 93 includes a column processing unit 94, a horizontal driving unit 95, and a vertical driving unit 97. Operations of the driving unit 93 are controlled by a control circuit (not illustrated). The pixel array unit 91, the column processing unit 94, the horizontal driving unit 95, and the vertical driving unit 97 are formed on a semiconductor substrate (not illustrated). The solid-state imaging apparatus further includes a signal processing unit 99.

The pixel array unit 91 is formed by arranging, in a matrix pattern, pixels 92 having a photoelectric conversion unit and a floating diffusion region (a charge storage region) to which a photoelectrically converted charge is transferred. Each pixel 92 is connected on a per row basis to the vertical driving unit 97 via a control line 98. In addition, each pixel 92 is connected on a per column basis to the column processing unit 94 via a vertical signal line (VSL) 96.

Light collected by an optical system (not illustrated) is incident to the pixel array unit 91. The pixel 92 outputs a pixel signal with a level in accordance with light intensity of the received light. An image of a subject is constructed by the pixel signal.

The pixel 92 is constituted by a photoelectric conversion unit made of a photodiode (PD) or the like, a floating diffusion region (a charge storage region) to which a charge from the photoelectric conversion unit is transferred, and a pixel transistor for driving the pixel. For example, a configuration can be adopted in which these components are formed inside a p-type well provided in an n-type semiconductor substrate. In the present disclosure, a transfer transistor, an amplifying transistor, a reset transistor, a selective transistor, or the like is defined as the pixel transistor.

In the pixel array unit 91, the control line 98 is formed in correspondence with each pixel row. The vertical driving unit 97 supplies the pixels 92 of the pixel array unit 91 via the control line 98 with a drive signal for sequentially driving the pixels 92 on a per row basis. FIG. 1 shows one control line 98 for each pixel row for convenience of illustration. In reality, a plurality of control lines are arranged in correspondence with a single pixel row.

In addition, in the pixel array unit 91, the VSL 96 is formed in correspondence with each pixel column. A signal (a signal level or a reset level) output from the pixel 92 is sent to the column processing unit 94 via the VSL 96. The column processing unit 94 applies Double Data Sampling (DDS) based on the signal output from the pixel 92 and subsequently performs A/D conversion. The column processing unit 94 can be configured to perform DDS processing in parallel on a per pixel row basis.

The column processing unit 94 is operated by a drive signal from the horizontal driving unit 95. The horizontal driving unit 95 is constituted by a logic circuit such as a shift register or an address decoder. Pixel signals from the column processing unit 94 are sequentially output to the signal processing unit 99 for each of the plurality of pixel columns arranged in the pixel array unit 91.

For example, the signal processing unit 99 applies various kinds of signal processing to a pixel signal from the column processing unit 94 and outputs the processed pixel signal as image output. For example, the signal processing unit 99 may be integrally formed in a semiconductor substrate on which the pixel array unit 91 is formed or may be provided on a separate substrate. Alternatively, the signal processing unit 99 may be processing by a DSP or software.

The vertical driving unit 97 is constituted by a logic circuit such as a shift register or an address decoder and drives the respective pixels 92 of the pixel array unit 91 all at once or in row units. Specifically, the pixels 92 are driven so that reset, exposure, and charge transfer of the pixels 92 are performed simultaneously for all pixels 92 but read is performed in row units.

So-called global exposure is performed by batch reset and batch exposure. In addition, read and scan involves sequentially selecting and scanning the pixels 92 of the pixel array unit 91 in row units. In the present disclosure, global exposure is performed by initializing the photoelectric conversion units of all pixels 92 of the pixel array unit 91 and then simultaneously storing signal charges in the photoelectric conversion units in all pixels within a period in which the pixels are sequentially scanned in row units and all pixels are read. A period from initializing the photoelectric conversion units and newly starting exposure to performing transfer is considered an exposure period (a storage period of photoelectric charges).

<Structure of Solid-State Imaging Apparatus>

Figure 2:
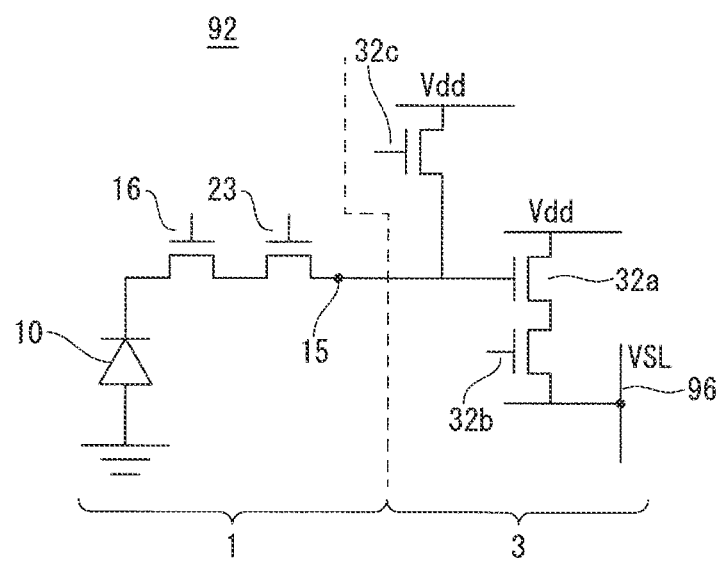
FIG. 2 is a diagram showing an example of an equivalent circuit of a pixel of a solid-state imaging apparatus according to a first embodiment of the present disclosure.

FIG. 2 shows an example of an equivalent circuit of the pixel 92 of a solid-state imaging apparatus according to a first embodiment. As shown in FIG. 2, a photoelectric conversion unit (PD) 10 with a grounded anode is connected to a charge holding unit 23 via a transfer gate structure 16 that functions as a transfer transistor. The charge holding unit 23 is connected to a charge storage region (a floating diffusion region) 15. The charge storage region 15 is connected to a source electrode of a reset transistor 32c and a gate electrode of an amplifying transistor 32a. A source electrode of the amplifying transistor 32a is connected to a drain electrode of a selective transistor 32b. A source electrode of the selective transistor 32b is connected to the vertical signal line (VSL) 96. Respective drain electrodes of the amplifying transistor 32a and the reset transistor 32c are connected to a power supply Vdd.

Figure 3A:
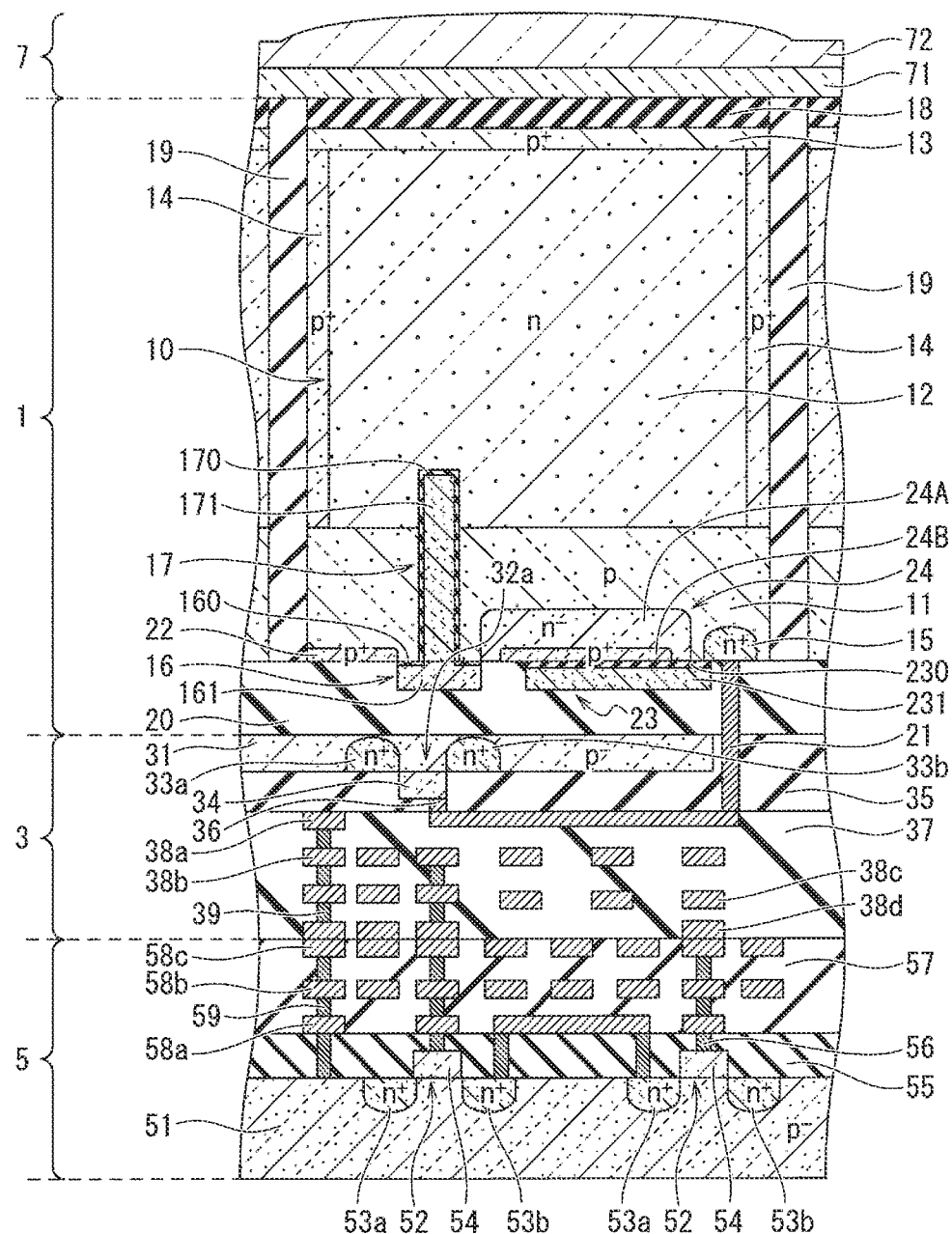
FIG. 3A is a schematic sectional view showing an example of the solid-state imaging apparatus according to the first embodiment of the present disclosure.

As shown in FIG. 3A, the solid-state imaging apparatus according to the first embodiment includes the charge holding unit 23 with a capacitor structure on a first substrate 1. The charge holding unit 23 is constituted by a MOS-type capacitor. The charge holding unit 23 that is a capacitative element has an embedded capacitance region 24 having a p-n junction provided in a well region 11, a capacitor insulating film 230 provided on an upper surface of the embedded capacitance region 24, and a capacitor electrode 231 provided on an upper surface of the capacitor insulating film 230. The embedded capacitance region 24 has an $n^-$-type first embedded region 24A that is provided on a lower surface of the capacitor insulating film 230 and a $p^+$-type second embedded region 24B that is embedded in the first embedded region 24A. The first embedded region 24A, the second embedded region 24B, and the well region 11 constitute a main part of a capacitor. While an equivalent circuit of the charge holding unit 23 shown in FIG. 3A is denoted by a symbol similar to that of a MOSFET in FIG. 2, a signal charge read by the transfer gate structure 16 passes through a semiconductor layer of the well region 11 and is temporarily held by the charge holding unit 23. The signal charge held by the charge holding unit 23 is guided from the charge holding unit 23 to the charge storage region 15. In addition, the signal charge is transferred to a gate electrode 34 of a pixel transistor of a second substrate 3 such as the amplifying transistor 32a through a through connecting conductor (a through via plug) 21. The charge holding unit 23 is provided with the capacitor electrode 231 and the capacitor electrode 231 is turned on and off at desired timings to enable a transfer timing to be measured. Therefore, the signal charge held by the charge holding unit 23 in the respective pixels can be collectively transferred to each charge storage region 15 at the same time to enable a global shutter function to be realized.

Figure 3B:
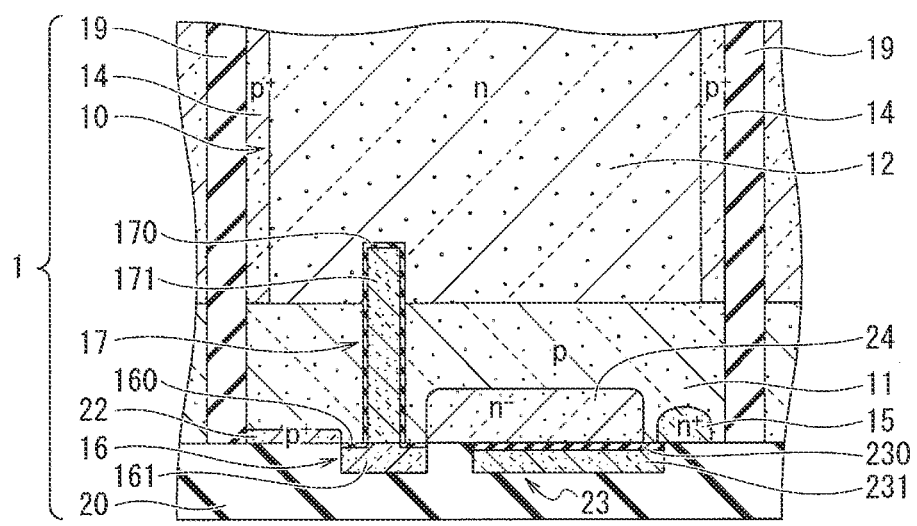
FIG. 3B is a schematic sectional view showing another example of a charge holding unit used in the solid-state imaging apparatus according to the first embodiment of the present disclosure.

In the first embodiment, an amount of signal charges that are stored in the charge storage region 15 can be increased by including the charge holding unit 23 that has a function of storing signal charges. Therefore, even in the case of incidence of extremely strong light, using the charge holding unit 23 as an auxiliary storage region of the charge storage region 15, a dynamic range can be expanded. In addition, since a charge attributable to a dark current stored in the charge holding unit 23 and an excessive signal charge can be released via the reset transistor 32c, the solid-state imaging apparatus can be provided with a global shutter function. As a result, skewing or the like of a picture that is observed in a rolling shutter adopted by an ordinary CMOS solid-state imaging apparatus can be suppressed and picture forming can be performed with high accuracy. A structure of the charge holding unit 23 having the embedded capacitance region 24, the capacitor insulating film 230, and the capacitor electrode 231 illustrated in FIG. 3A can also be made to function as a variable capacitance capacitor depending on a magnitude of a voltage to be applied to the capacitor electrode 231. For example, the $p^+$-type second embedded region 24B may be omitted and only the $n^-$-type embedded capacitance region 24 may be retained as shown in FIG. 3B. Therefore, operations can be performed in a mode where conversion efficiency to a voltage in the charge storage region 15 is adjusted by varying a capacitance of the embedded capacitance region 24. Furthermore, providing the charge holding unit 23 with an amplifying function similar to that of a MOS transistor (more generally, a "MIS transistor") realizes a mode where an amount of signal charges to be transferred from the charge holding unit 23 to the charge storage region 15 is adjusted by a magnitude of a voltage to be applied to the capacitor electrode 231. While a single pixel is shown in FIG. 3A, a shared pixel may be used. In addition, a structure may be adopted in which a transfer gate structure of the solid-state imaging apparatus according to the first embodiment from which a vertical gate 17 has been omitted is provided with the charge holding unit 23.

In addition, as shown in FIG. 3A, the solid-state imaging apparatus according to the first embodiment has three laminated substrates: the first substrate 1, the second substrate 3, and a third substrate 5. The first substrate 1 is provided with a plurality of photoelectric conversion units 10 having been arranged in a matrix pattern and generates a signal charge by photoelectric conversion. The second substrate 3 integrates pixel circuits that process a signal charge from the photoelectric conversion unit 10 and outputs a pixel signal. The third substrate 5 integrates logic circuits having functions such as image processing and signal processing, and processes a pixel signal and outputs an image. The first substrate 1 and the second substrate 3 are bonded to each other via an interlayer insulating film 20 and the second substrate 3 and the third substrate 5 are bonded to each other via an interlayer insulating film 57. The first substrate 1 is a backside illumination-type substrate for receiving incident light L that is incident from a backside (an upper surface in FIG. 3A) of the first substrate 1. A logic circuit may be provided either at a position that overlaps with a pixel region or in a peripheral region other than a pixel region on the laminated third substrate. Furthermore, a logic circuit may be provided in a peripheral region other than a pixel region on the first and second substrates. While the three substrates are described using ordinals for convenience's sake, the ordinals do not define an order of the respective substrates and the substrates can be described in a different order when necessary.

The photoelectric conversion unit 10 that constitutes a photodiode (PD) is provided in plurality in a matrix pattern in the first substrate 1 that constitutes an uppermost later in FIG. 3A. The photoelectric conversion unit 10 constitutes a main part that defines a region of each pixel of the solid-state imaging apparatus. A semiconductor substrate such as a silicon (Si) wafer can be used as a semiconductor layer (a first semiconductor layer) (11 and 12) of the first substrate 1. FIG. 3A illustrates one of consecutively arranged photoelectric conversion units 10 as a sectional view of a part of the first substrate 1. A planarizing film 18 and an incidence unit 7 made up of a color filter (CF) 71, a microlens 72, and the like are provided above the photoelectric conversion unit 10 in the arrangement shown in FIG. 3A. Incident light L that is incident sequentially via the microlens 72, the color filter 71, and the planarizing film 18 is received by the photoelectric conversion unit 10 and photoelectric conversion is performed.

In the structure illustrated in FIG. 3A, the photoelectric conversion unit 10 constitutes a p-n junction using a well region 11 of a first conduction type (p-type) and a charge generation region 12 of a second conduction type (n-type) that is provided in contact with the well region 11 on top of the well region 11. The photoelectric conversion unit 10 further includes a p$^+$-type bottom pinning layer 13 that is provided in contact with the charge generation region 12 on top of the charge generation region 12 and a p$^+$-type side pinning layer 14 that encloses a side wall of the charge generation region 12. The charge generation region 12 of the photoelectric conversion unit 10 functions as a part of the PD that generates a charge (an electron). In other words, the photoelectric conversion unit 10 has a hole accumulation diode (HAD (registered trademark)) structure and is capable of suppressing generation of a dark current at an interface with the bottom pinning layer 13 on an upper surface side of the charge generation region 12, an interface with the side pinning layer 14 on a side surface side, and an interface with the well region 11.

A pixel separating unit 19 that electrically separates the plurality of pixels arranged in a matrix pattern into individual pixels is provided inside the first substrate 1. The photoelectric conversion unit 10 is provided in each of the plurality of regions that are partitioned by the pixel separating unit 19. In the orientation shown in FIG. 3A, when the solid-state imaging apparatus is viewed from an upper surface side, the pixel separating unit 19 is formed in, for example, a grid-like shape so as to be interposed between the plurality of pixels. A shape of the grid that forms the pixel separating unit 19 is not limited to a rectangular grid and other topology such as a hexagonal honeycomb grid may be adopted instead. The photoelectric conversion unit 10 to constitute a pixel is arranged in each of the regions partitioned in a grid pattern by the pixel separating unit 19.

Each pixel of the solid-state imaging apparatus according to the first embodiment of the present disclosure further includes a T-shaped transfer gate structure 16 including the vertical gate 17 that transfers a signal charge from the photoelectric conversion unit 10 of each pixel. The transfer gate structure 16 has a gate insulating film 160 that is in contact with a lower surface of the well region 11 and a planer gate electrode 161 that is in contact with the gate insulating film 160 from below in the orientation shown in FIG. 3A. In the vertical gate 17, a gate insulating film 170 that extends from the gate insulating film 160 is provided on a bottom surface and a side surface of a groove that is provided so as to penetrate the well region 11 and reach the charge generation region 12, and a vertical gate electrode 171 is embedded so as to extend from the planer gate electrode 161 via the gate insulating film 170. An insulating film such as a silicon dioxide film ($SiO_2$) is used as the gate insulating films 160 and 170. A conductor such as impurity-added polycrystalline (poly) silicon (p-Si) or a high-melting point metal is used as the planer gate electrode 161 and the vertical gate electrode 171. On a lower surface side of the well region 11 in a lower part of the photoelectric conversion unit 10, the charge storage region 15 that temporarily stores a signal charge having been transferred from the photoelectric conversion unit 10 of each pixel is embedded in a lower part of the well region 11 via the transfer gate structure 16. The charge storage region 15 is constituted by a semiconductor region in an electrically floating state such as a floating diffusion region. Furthermore, an interlayer insulating film 20 is formed so as to cover a part of a lower surface of the well region 11, a part of a lower surface of the charge storage region 15, and a lower surface of the transfer gate structure 16.

In FIG. 3A, the planarizing film 18 is provided in contact with the bottom pinning layer 13 on top of the bottom pinning layer 13. Since the solid-state imaging apparatus according to the present disclosure is a backside illumination-type solid-state imaging apparatus, the planarizing film 18 is formed using an insulating material that transmits light such as $SiO_2$. The pixel separating unit 19 is provided by coating an inner side of an engraved pixel separation groove with an insulating film and embedding a light-shielding metal such as tungsten (W) into the pixel separation groove via the insulating film. The pixel separating unit 19 may be constructed by using a "fixed charge film" such as a hafnium oxide film ($HfO_2$ film) as the insulating film for coating the inner side of the pixel separation groove and filling the pixel separation groove with the insulating film or the like. When the pixel separating unit 19 is constructed using a fixed charge film, the side pinning layer 14 that constitutes a side surface-side interface with the charge generation region 12 of the photoelectric conversion unit 10 may be omitted.

The fixed charge film that constitutes the pixel separating unit 19 is formed using a high dielectric having a negative fixed charge so that a positive charge (hole) storage region is formed and generation of a dark current is suppressed in an interface portion with the charge generation region 12. The negative fixed charge that is distributed in the fixed charge film causes an electric field to be applied to an interface with the charge generation region 12 and a positive charge (hole) storage region is formed in the charge generation region 12. As the fixed charge film that constitutes the pixel separating unit 19, besides $HfO_2$, an insulating film that includes at least one of oxides of hafnium (Hf), zirconium (Zr), aluminum (Al), tantalum (Ta), titanium (Ti), magnesium (Mg), yttrium (Y), a lanthanoid element, and the like can be used.

In the photoelectric conversion unit 10 of each pixel of the solid-state imaging apparatus according to the first embodiment, the well region 11 to constitute an anode of the PD is grounded via a p$^+$-type well contact region 22. In the solid-state imaging apparatus, a signal charge (for example, an electron) generated by the photoelectric conversion unit 10 is stored in the charge storage region 15 via the transfer gate structure 16 and the like. The stored signal charge is read as an electric signal from the charge storage region 15 in a floating state by the amplifying transistor 32a via the through connecting conductor (the through via plug) 21, a wiring of a first wiring layer 38a, and a connecting conductor (a contact plug) 36, and output to the vertical signal line (VSL) 96 shown in FIG. 1 or FIG. 2.

In the solid-state imaging apparatus according to the first embodiment, the interlayer insulating film 20 is provided on a front surface (a lower surface in FIG. 3A) of the first substrate 1 on an opposite side to a rear surface (an upper surface in FIG. 3A) on which the incidence unit 7 and the like are provided. The second substrate 3 including a pixel transistor is provided on an upper surface (a lower surface in FIG. 3A) of the interlayer insulating film 20, and the first substrate 1 and the second substrate 3 are bonded to each other via the interlayer insulating film 20.

For example, the three pixel transistors including the amplifying transistor (a signal-readout transistor) 32a, the selective transistor (a switching transistor) 32b, and the reset transistor 32c that constitute the pixel circuit (a signal-readout circuit) shown in FIG. 2 and the like are arranged on a semiconductor layer (a second semiconductor layer) 31 of the second substrate 3. While all three pixel transistors are provided on the second substrate 3 in the first embodiment, this configuration is not restrictive. For example, only the amplifying transistor 32a may be provided on the second substrate 3, and one of or both the selective transistor 32b and the reset transistor 32c may be provided on the first substrate 1 or the third substrate 5.

As shown in FIG. 2, a drain electrode of the amplifying transistor 32a is connected to the power supply Vdd and a source electrode of the amplifying transistor 32a is connected to a drain electrode of the selective transistor 32b for pixel selection. A gate electrode of the amplifying transistor 32a is connected to the charge storage region 15 in a floating state and reads a signal charge from the charge storage region 15. A drain electrode of the reset transistor 32c is connected to the power supply Vdd and a source electrode of the reset transistor 32c is connected to the gate electrode of the amplifying transistor 32a. By setting a reset control signal to be applied to the gate electrode of the reset transistor 32c to a high (H) level, the reset transistor 32c becomes conductive and resets the charge stored in the charge storage region 15. A source electrode of the selective transistor 32b for pixel selection which is another circuit element that reads a signal charge from the charge storage region 15 is connected to the vertical signal line 96, and a gate electrode of the selective transistor 32b is supplied with a control signal for horizontal line selection from a vertical shift register. Setting the selection control signal to a high (H) level causes the selective transistor 32b to become conductive, and a current corresponding to a potential of the charge storage region 15 having been amplified by the signal-reading amplifying transistor 32a flows through the vertical signal line 96.

An interlayer insulating film 35 is provided so as to cover a front surface (a lower surface in FIG. 3A) of the second semiconductor layer 31 of the second substrate 3 and a surface of the exposed interlayer insulating film 20. An interlayer insulating film 37 that internally has a plurality of wiring layers including the first wiring layer 38a, a second wiring layer 38b, a third wiring layer 38c, and a fourth wiring layer 38d is provided on a front surface of the interlayer insulating film 35. In other words, while the interlayer insulating film 37, the first wiring layer 38a, the second wiring layer 38b, the third wiring layer 38c, and the fourth wiring layer 38d constitute a multilayer wiring layer, the multilayer wiring layer is not limited to the 4-layer structure shown in FIG. 3A.

Although details are not illustrated, in the interlayer insulating film 37, the plurality of wiring layers including the first wiring layer 38a, the second wiring layer 38b, the third wiring layer 38c, and the fourth wiring layer 38d are electrically connected to each element of a pixel circuit formed in the second semiconductor layer 31 of the second substrate 3. FIG. 3A schematically shows a sectional structure of the amplifying transistor 32a among the signal-readout circuit shown in FIG. 2, and a source region 33a and a drain region 33b of the amplifying transistor 32a are arranged so as to be separated from each other on a lower surface of the second semiconductor layer 31 of the second substrate 3. In addition, the gate electrode 34 is arranged via a gate insulating film (not illustrated) on a lower surface of the second semiconductor layer 31 between the source region 33a and the drain region 33b to constitute the amplifying transistor 32a. It should be noted that FIG. 2 is simply a schematic illustration and positions of the source region 33a and the drain region 33b in the representation of the sectional view in FIG. 3A may be interchanged. In addition, an end of a wiring of the first wiring layer 38a in contact with the interlayer insulating film 35 is electrically connected to the through connecting conductor (the through via plug) 21 penetrating the interlayer insulating film 35 and the interlayer insulating film 20 to be electrically connected to the charge storage region 15. Furthermore, another end of a wiring portion of the first wiring layer 38a that is exposed as a horizontally long wiring on the cross section shown in FIG. 3A passes through the interlayer insulating film 35 to be electrically connected to the connecting conductor (the contact plug) 36 that is electrically connected to the gate electrode 34 of the amplifying transistor 32a. In a similar manner, another pixel transistor, a signal line such as a VSL, a power supply line, a grounding line, and the like are electrically connected to a wiring of the second wiring layer 38b, a wiring of the third wiring layer 38c, and a wiring of the fourth wiring layer 38d via a via plug 39 or the like.

The third substrate 5 that constitutes a lowermost layer of the 3-layer laminated structure shown in FIG. 3A is bonded to the front surface (the lower surface in FIG. 3A) of the interlayer insulating film 37 of the second substrate 3 via the interlayer insulating film 57. The third substrate 5 is provided with, for example, a semiconductor layer (a third semiconductor layer) 51 made of a Si semiconductor with a thickness of several 100 μm as a supporting substrate. The third semiconductor layer 51 is provided with a logic circuit transistor 52 made up of a plurality of logic transistors or the like having a first main electrode region 53a, a second main electrode region 53b, and a control electrode 54. In this case, a "first main electrode region" and a "second main electrode region" refer to a semiconductor region to be one of a source region and a drain region in a MOS field-effect transistor (MOSFET), a MOS static induction transistor (MOSSIT), or the like. Therefore, when the "first main electrode region" refers to a source region, the "second main electrode region" refers to a drain region. In addition, a "control electrode" refers to an electrode for controlling a main current that flows between the first main electrode region and the second main electrode region. For example, in the case of a MOSFET, a gate electrode for controlling a main current that flows between a source region and a drain region corresponds to the control electrode. An interlayer insulating film 55 is provided between the third semiconductor layer 51 and the interlayer insulating film 57 so as to cover the logic transistors and a surface of the third semiconductor layer 51. A first wiring layer 58a, a second wiring layer 58b, and a third wiring layer 58c are provided as a multilayer wiring inside the interlayer insulating film 57. While a multilayer wiring constituted by a 3-layer structure is schematically illustrated in FIG. 3A, it is needless to say that a multi-layer wiring structure used in the third substrate 5 is not limited to a 3-layer structure. Contact plugs 56 to be electrically connected to each of the control electrode 54, the first main electrode region 53a, and the second main electrode region 53b of the logic circuit transistor 52 through the interlayer insulating film 55 are respectively connected to wirings of the first wiring layer 58a. In addition, the logic circuit transistor 52, a signal line, a power supply line, a grounding line, and the like are electrically connected to a wiring of the first wiring layer 58a, a wiring of the second wiring layer 58b, and a wiring of the third wiring layer 58c via a contact plug 56 and a via plug 59 or the like.

Figure 3C:
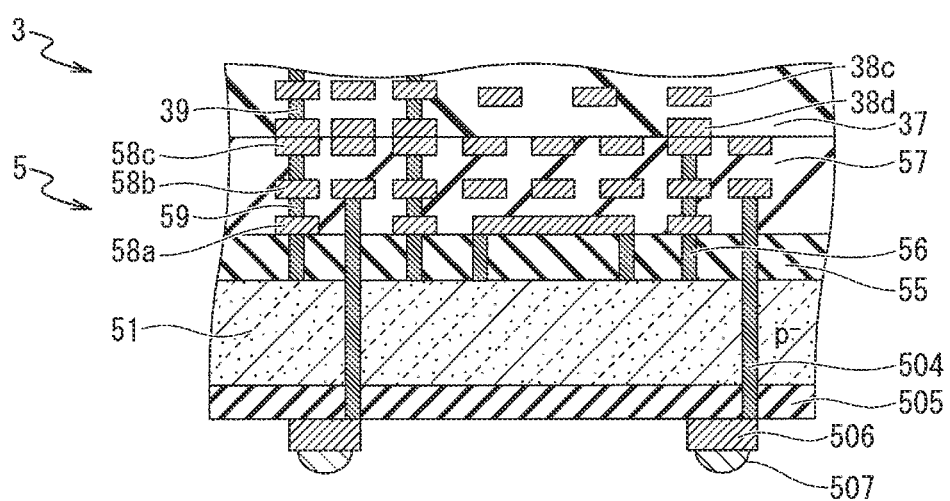
FIG. 3C is a schematic sectional view showing an example of a connecting electrode wiring used in the solid-state imaging apparatus according to the first embodiment of the present disclosure.

Although not illustrated in FIG. 3A, an opening of a pad that is an input/output electrode for connecting a signal line, a power supply line, a grounding line, and the like to external wirings is provided. A metal that enables wire bonding such as Al is desirable as the pad. The pad need only be formed in any one wiring layer of the third substrate 5 and the second substrate 3. In addition, a chip scale package (CSP) structure can be adopted as the input/output electrode of external wirings. As shown in FIG. 3C, an insulating film 505 is provided on a lower surface of the third semiconductor layer 51. A wiring 506 provided on a lower surface of the insulating film 505 is electrically connected via a via plug 504 to any one of the wiring layers of the second substrate 3 and the third substrate 5 such as the second wiring layer 58b of the third substrate 5. A bump 507 of solder or the like is provided on a lower surface of the wiring 506. A signal line, a power supply line, a grounding line, and the like can be connected to external wirings via the bump 507.

<Manufacturing Method of Solid-State Imaging Apparatus>

Next, with reference to process sectional views shown in FIGS. 4 to 10A, a manufacturing method of the solid-state imaging apparatus according to the first embodiment will be described with a main focus on a structure corresponding to two pixels. It should be noted that the manufacturing method of the solid-state imaging apparatus described below is merely an example and the solid-state imaging apparatus can be realized by various other manufacturing methods including modifications of the manufacturing method described below within the purport described in the scope of claims.

First, an n-type epitaxial growth layer to be an n-type charge generation region 12 is grown on a semiconductor substrate having a $p^+$-type layer to be the bottom pinning layer 13. Next, in order to form a pattern of the side pinning layer 14, a mask for selective ion implantation is formed by photolithography, and ion implantation of impurity ions presenting a p-type such as boron (B) is performed in multiple stages by adjusting accelerating voltage to vary a projected range so that the charge generation region 12 remains in a part of the n-type epitaxial growth layer. After removing the selective ion implantation mask for forming the side pinning layer 14, a p-type impurity such as B is thermally diffused on a surface of the n-type epitaxial growth layer to form the well region 11. Due to a heat treatment when forming the well region 11, ions implanted in multiple stages along a pattern of the side pinning layer 14 are also activated and the side pinning layer 14 shown in FIG. 3A is formed.

Subsequently, a thermal oxide film is formed on an upper surface of the well region 11. Furthermore, an etching mask for forming a pixel separation groove of the pixel separating unit 19 is formed by aligning the mask to the pattern of the side pinning layer 14 using photolithography. Using the etching mask, a hole is selectively opened by reactive ion etching (RIE) or the like at a specific location of the thermal oxide film on the upper surface of the well region 11 to form an oxide film mask for forming the pixel separation groove of the pixel separating unit 19. After forming the oxide film mask, the etching mask used to form the oxide film mask is removed. In addition, using the oxide film mask, the pixel separation groove is formed by dry etching such as RIE. After the pixel separation groove is cut, a fixed charge film such as an $HfO_2$ film is formed by chemical vapor deposition (CVD) or the like on a side wall of the pixel separation groove. Subsequently, a pixel separation insulating film such as a $SiO_2$ film is embedded by CVD or the like in the pixel separation groove in which the fixed charge film has been formed. By planarizing and removing the fixed charge film and the pixel separation insulating film that protrude from the pixel separation groove by etch-back, chemical mechanical polishing (CMP), or the like, a pattern of the pixel separating unit 19 shown in FIG. 3A is formed in the first semiconductor layer (11 and 12). Alternatively, the side pinning layer 14 may be formed after forming the pixel separating unit 19. For example, after epitaxially growing the charge generation region 12, the pixel separation groove is first formed. The $p^+$-type side pinning layer 14 can be formed by an active heat treatment by implanting p-type impurity ions via the side wall of the pixel separation groove. Alternatively, the $p^+$-type side pinning layer 14 can be formed by solid-phase diffusion of impurities by depositing a Si layer to which p-type impurities have been added on the side wall of the pixel separation groove.

Figure 4:
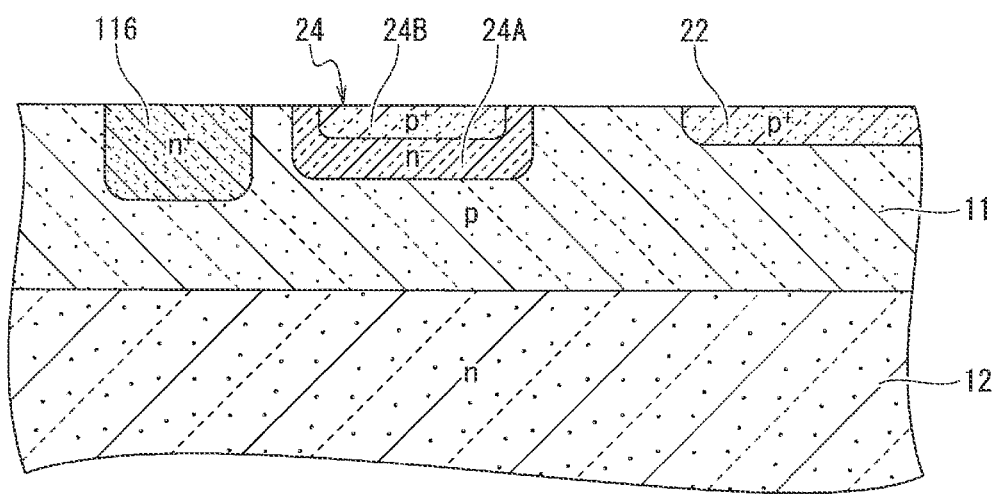
FIG. 4 is a schematic sectional view for explaining an example of a step of a manufacturing method of the solid-state imaging apparatus according to the first embodiment of the present disclosure.

Subsequently, a mask for selective ion implantation having an opening in a region where the charge storage region 15 is to be formed is formed by photolithography on an upper surface of the first semiconductor layer (11 and 12), and ions presenting an n-type such as phosphorus (p) are implanted. By performing a heat treatment after removing a photoresist film used for the mask for n-type ion implantation, an $n^+$-type extension region 116 of the charge storage region 15 is formed as shown in FIG. 4 in an upper part of the well region 11 on an upper surface side of the first semiconductor layer (11 and 12). Furthermore, a mask for selective ion implantation having an opening in a region where the first embedded region 24A of the embedded capacitance region 24 is to be formed is formed by photolithography, and ions presenting an n-type such as As are implanted at a shallower projected range than in the case of the extension region 116. After removing a photoresist film used for the mask for n-type ion implantation, a mask for selective ion implantation having an opening in a region where the second embedded region 24B of the embedded capacitance region 24 and the well contact region 22 are to be formed is formed by photolithography, and ions presenting a p-type such as B are implanted at a shallower projected range than in the case of the extension region 116 so that the second embedded region 24B becomes embedded in the first embedded region 24A. After removing a photoresist film used for the mask for p-type ion implantation, by performing a heat treatment, the embedded capacitance region 24 having the $n^-$-type first embedded region 24A and the $p^+$-type second embedded region 24B and the $p^+$-type well contact region 22 are formed as shown in FIG. 4 in an upper part of the well region 11.

Figure 5:
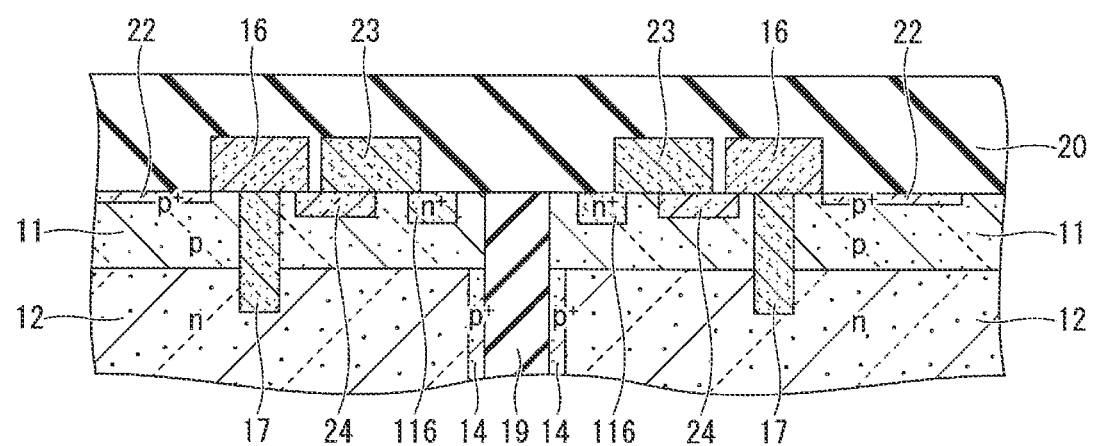
FIG. 5 is a schematic sectional view which is a continuation of FIG. 4 for explaining an example of a step of a manufacturing method of the solid-state imaging apparatus according to the first embodiment of the present disclosure.

Subsequently, using photolithography and dry etching such as RIE, a vertical gate trench that penetrates the well region 11 and reaches an upper part of the charge generation region 12 is cut between the embedded capacitance region 24 and the well contact region 22. After the vertical gate trench is formed, a photoresist film used as an etching mask is removed and a thermal oxide film is formed so as to cover an upper surface of the well region 11 and an inner wall of the vertical gate trench. In addition, an impurity-added polycrystalline silicon (Si) film (a DOPOS film) to which impurities have been added by CVD or the like is embedded inside the vertical gate trench and, at the same time, deposited on the upper surface of the well region 11 to a thickness of 200 to 1000 nm. By patterning the DOPOS film using photolithography and dry etching such as RIE, the vertical gate 17 is formed inside the vertical gate trench as shown in FIG. 5 and, at the same time, patterns of a planar gate 16 and the charge holding unit 23 are formed on the upper surface of the well region 11. While the formation of the vertical gate 17 has been described using a DOPOS film, the formation of the vertical gate 17 is not limited thereto. For example, after embedding a non-doped polycrystalline Si film that does not contain impurities inside the trench, impurities may be added by ion implantation or the like. Subsequently, the interlayer insulating film 20 is formed by CVD or the like on the upper surface of the well region 11 on which the planer gate 16 and the charge holding unit 23 are formed. In the first semiconductor layer (11 and 12) having been formed in this manner, an example of a gate electrode is polycrystalline Si. When forming a functional element such as a pixel transistor on the second substrate that is provided with a pixel circuit, since a heat treatment near 1000° C. is applied, a gate electrode material capable of withstanding such a temperature is desired. For example, the gate electrode may be formed by a laminate of a high-melting point metal such as tungsten (W) or molybdenum (Mo) and polycrystalline Si or solely by a high-melting point metal. A surface of the interlayer insulating film 20 is planarized as shown in FIG. 5 by CMP or the like.

Figure 6:
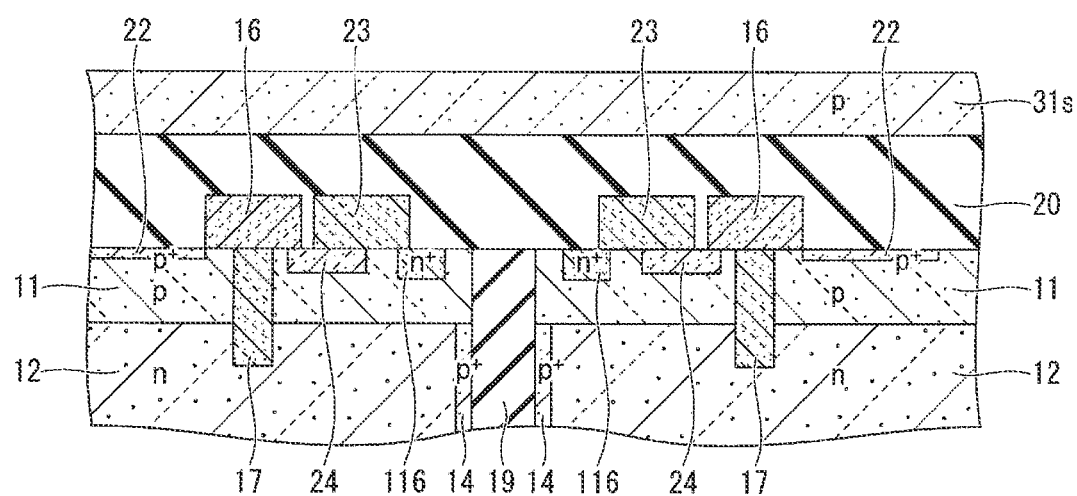
FIG. 6 is a schematic sectional view which is a continuation of FIG. 5 for explaining an example of a step of a manufacturing method of the solid-state imaging apparatus according to the first embodiment of the present disclosure.

As shown in FIG. 6, a semiconductor layer 31s made up of a Si substrate and the first semiconductor layer (11 and 12) are bonded via the interlayer insulating film 20 using a wafer direct bonding technique. Subsequently, by grinding, polishing such as CMP, etching, and the like, the semiconductor layer 31s is thinned down to a desired thickness from an upper surface of the semiconductor layer 31s to form the second semiconductor layer 31. In doing so, the second semiconductor layer 31 is given a film thickness necessary for the first main electrode region and the second main electrode region of the pixel transistor. The film thickness of the second semiconductor layer 31 differs depending on a concept of the pixel transistor. For example, when the film thickness of the first semiconductor layer (11 and 12) is around 1 μm to 10 μm, the film thickness of the second semiconductor layer 31 is within a range of several nm to several ten μm and more desirably several ten nm to several μm.

Figure 7:
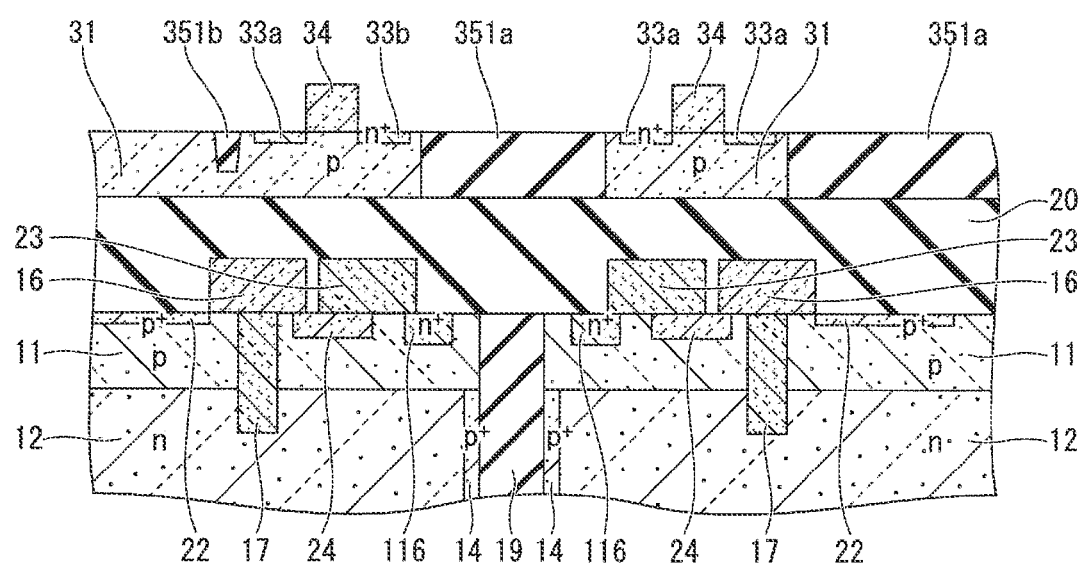
FIG. 7 is a schematic sectional view which is a continuation of FIG. 6 for explaining an example of a step of a manufacturing method of the solid-state imaging apparatus according to the first embodiment of the present disclosure.

FIG. 7 shows two types of pixel circuit separation regions: a deep pixel circuit separation region 351a that penetrates the second semiconductor layer 31 and a shallow pixel circuit separation region 351b being given a depth that does not penetrate the second semiconductor layer 31. Therefore, an etching mask for forming a first pixel separation groove of the deep pixel circuit separation region 351a shown in FIG. 7 is first formed using photolithography. Using the etching mask, the first pixel separation groove is formed by dry etching such as RIE until the interlayer insulating film 20 is reached. A photoresist film used as a mask for forming the first pixel separation groove is removed and an etching mask for forming a second pixel separation groove of the shallow pixel circuit separation region 351b is formed. Using the etching mask, the shallow second pixel separation groove that does not reach the interlayer insulating film 20 is formed by dry etching such as RIE. While a combined use of two types of element separation is described as a typical example, only the shallow element separation or only the deep element separation may be selectively used depending on application. After the first and second pixel separation grooves are cut, an insulating film is embedded in the first and second pixel separation grooves by CVD or the like. By planarizing and removing the insulating film that protrudes from the first and second pixel separation grooves by etch-back, CMP, or the like, patterns of the deep pixel circuit separation region 351a and the shallow pixel circuit separation region 351b are formed as shown in FIG. 7. The deep pixel circuit separation region 351a that penetrates the second semiconductor layer 31 is formed so as to come into contact with the first semiconductor layer (11 and 12) below.

By patterning the DOPOS film using photolithography and dry etching such as RIE, patterns of the gate electrodes 34 of pixel transistors such as an amplifying transistor, a reset transistor, and a selective transistor are respectively formed as shown in FIG. 7. Subsequently, with an opening pattern made by photolithography and an end of the gate electrode 34 as a mask for self-matching, impurity ions presenting an n-type are implanted in order to form a first main electrode region 33a and a second main electrode region 33b. Subsequently, by performing a heat treatment to activate the impurity ions, the first main electrode region 33a and the second main electrode region 33b are formed at positions that sandwich the respective gate electrodes 34.

Figure 8:
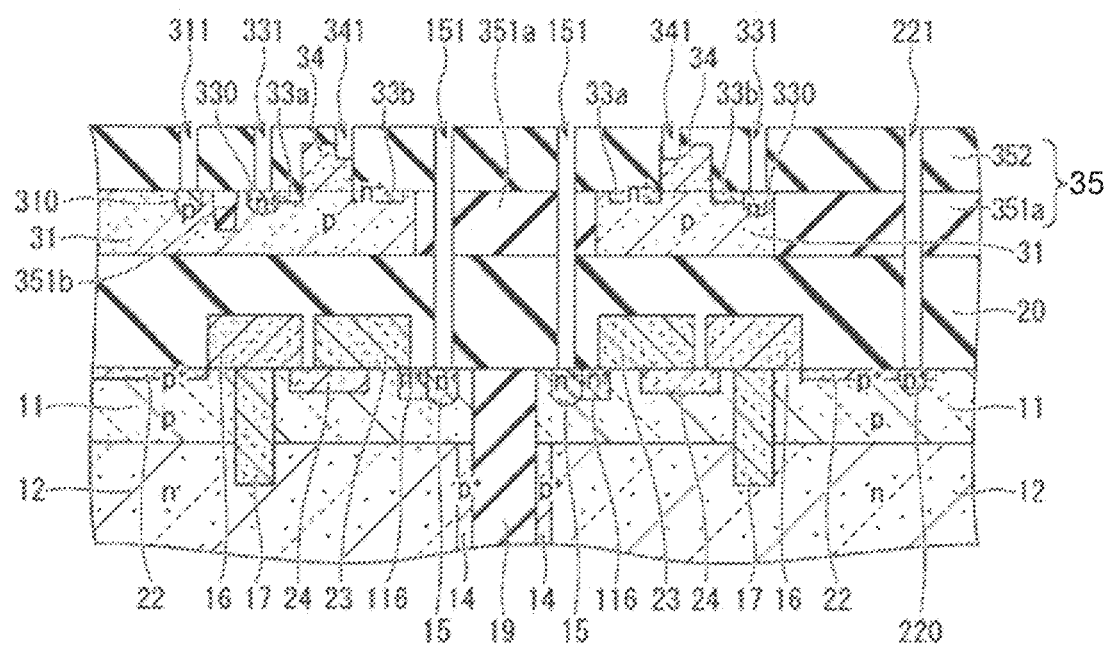
FIG. 8 is a schematic sectional view which is a continuation of FIG. 7 for explaining an example of a step of a manufacturing method of the solid-state imaging apparatus according to the first embodiment of the present disclosure.

As shown in FIG. 8, an interlayer insulating film 352 is formed so as to cover the gate electrodes 34 of the pixel transistors by CVD or the like to perform planarization. The interlayer insulating film 35 is formed by the pixel circuit separation regions 351a and 351b and the interlayer insulating film 352. Subsequently, contact openings 311, 331, 341, 151, 221, and the like are formed by RIE or the like. The opening 341 is provided so as to penetrate the interlayer insulating film 352 and reach the gate electrode 34. While the openings 151 and 221 form a contact via that exposes the extension region 116 of the first semiconductor layer (11 and 12) and a part of an upper surface of the well contact region 22, the contact via is passed through a region inside the pixel circuit separation region 351a that penetrates the second semiconductor layer 31 so as to prevent the second semiconductor layer 31 and a side wall of the contact via from coming into contact with each other. Furthermore, a high dose of n-type impurity ions are implanted via the openings 151 and 331 by photolithography, ion implantation, and the like. Subsequently, a photoresist film used for the mask for ion implantation is removed and a heat treatment is performed. By performing the heat treatment, as shown in FIG. 8, the charge storage region 15 with a higher impurity density than the extension region 116 is formed deeper than the extension region 116 so as to overlap with an end of the extension region 116 in an upper part of the well region 11 of the first semiconductor layer (11 and 12). While an example of introducing impurities into the semiconductor layers of the openings has been described, this step can be omitted by impurity control of the first and second semiconductor layers and depending on a state of damage to the semiconductor layers at the time of etching of the openings.

At the same time, in the first main electrode region 33a and the second main electrode region 33b of the second semiconductor layer 31, contact regions 330 with a higher impurity density than the first main electrode region 33a and the second main electrode region 33b are respectively formed deeper than the first main electrode region 33a and the second main electrode region 33b. Next, a high dose of p-type impurity ions are implanted via the openings 311 and 221 by photolithography, ion implantation, and the like. Subsequently, by removing a photoresist film used for the mask for ion implantation and performing a heat treatment, as shown in FIG. 8, a contact region 310 is formed in the second semiconductor layer 31 and a contact region 220 is formed in the well contact region 22 of the first semiconductor layer (11 and 12).

Figure 9:
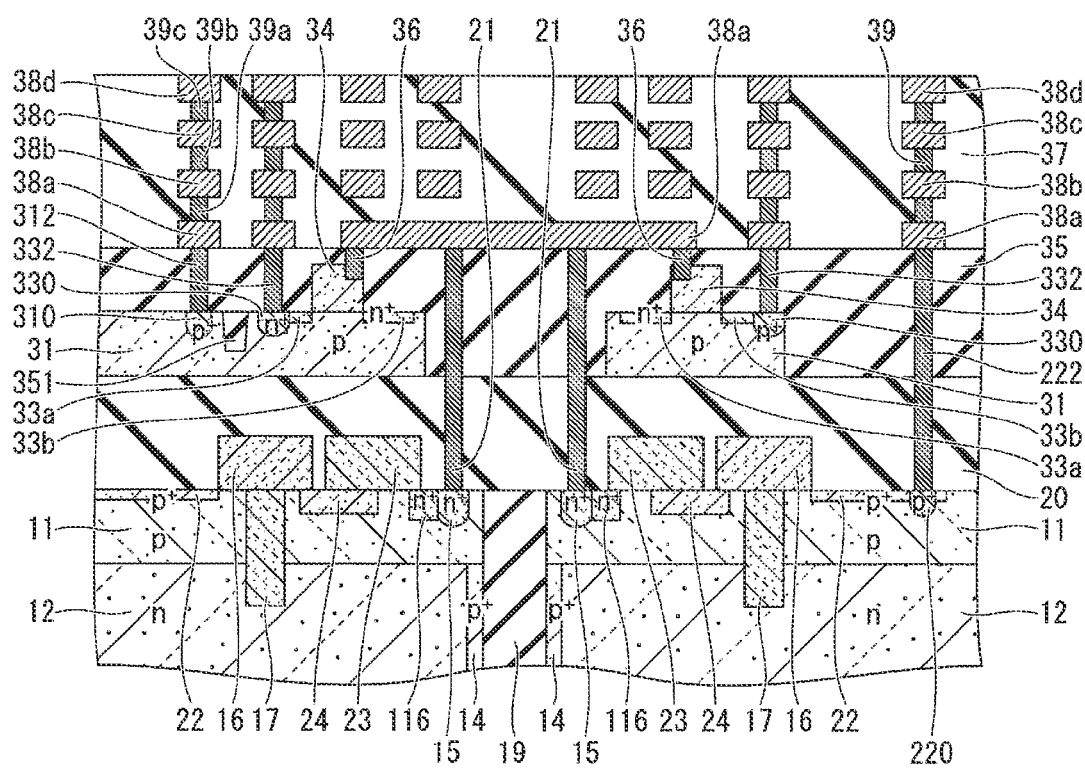
FIG. 9 is a schematic sectional view which is a continuation of FIG. 8 for explaining an example of a step of a manufacturing method of the solid-state imaging apparatus according to the first embodiment of the present disclosure.

Next, by CVD, plating, or the like, a metal such as W or copper (Cu) is embedded in the openings 311, 331, 341, 151, and 221. A metal film that protrudes from the openings 311, 331, 341, 151, and 221 and remains on the interlayer insulating film 35 is planarized and removed by etch-back, CMP, or the like, and via plugs 312 and 332, a contact plug 36, and through via plugs 21 and 222 are formed as shown in FIG. 9. The via plug 312 is electrically connected to the contact region 310 of the second semiconductor layer 31. The via plug 332 is electrically connected to the contact regions 330 of the first main electrode region 33a and the second main electrode region 33b. The contact plug 36 is electrically connected to the gate electrode 34. The through via plug 21 is electrically connected to the charge storage region 15. The through via plug 222 is electrically connected to the contact region 220 of the well contact region 22.

Next, by CVD or the like, an interlayer insulating film of a first layer in which a first wiring layer is to be formed is deposited on the interlayer insulating film 35. In addition, a groove (a trench) to be the first wiring layer is formed in the interlayer insulating film using photolithography and dry etching. Subsequently, after forming a barrier metal and a metal film such as seed Cu on an inner wall of the trench by sputtering or the like, Cu is deposited by electrolytic plating or the like so as to be completely embedded in the trench. Subsequently, by electrolytic polishing, CMP, or the like, Cu on the interlayer insulating film of the first layer is removed so that Cu only remains in the trench to form a wiring pattern of the first wiring layer 38a. An interlayer insulating film of a second layer is deposited on the wiring pattern of the first wiring layer 38a using CVD. A SiO$_2$ film-based material, a SiO$_2$ film-based material created by tetraethoxysilane (TEOS) gas, or a low dielectric constant material is applied to the interlayer insulating film of the second layer. In particular, a low dielectric constant material is desirably applied from the perspective of accelerating processing. In addition, the interlayer insulating film of the second layer is selectively opened using photolithography and dry etching and a via plug opening (for a via plug 39a) is formed until just before a part of the wiring layer of the first wiring layer 38a becomes exposed. After separating a photoresist of the present step, a wiring groove (trench) to be a second wiring layer is formed in the interlayer insulating film of the second layer using photolithography, dry etching, and the like. During processing of the trench to be the second wiring layer, the interlayer insulating film that does not reach the first wiring layer 38a upon forming the via flag opening described above is also etched at the same time. Therefore, the via plug opening is completely opened and an upper surface of the first wiring layer 38a is exposed inside the via plug opening. Although not illustrated, a SiC-based layer such as silicon carbide (SiC), oxygenated silicon carbide (SiCO), or nitrogenized silicon carbide (SiCN) is formed as a Cu diffusion prevention layer in an upper part of the first wiring layer 38a. The SiC-based layer functions as an etching stopper during the processing of the interlayer insulating film of the second layer. In addition, the SiC-based layer that is an etching stopper is etched to form an opening in which the second wiring layer 38b and the via plug 39a are to be embedded. Subsequently, by depositing a metal such as Cu so as to fill the opening using CVD and plating and planarizing the metal using CMP or the like, the via plug 39a of the first layer to be electrically connected to the first wiring layer 38a and the second wiring layer 38b are formed. While copper (Cu) is generally used as the metal, the metal is not limited to Cu.

Next, an interlayer insulating film of a third layer is deposited using CVD on a wiring pattern of the second wiring layer 38b formed in the step described above. In addition, the interlayer insulating film of the third layer is selectively opened using photolithography and dry etching and a via plug opening (for a via plug 39b) is formed until just before a part of the wiring layer of the second wiring layer 38b becomes exposed. After separating a photoresist of the present step, a wiring groove (trench) to be a third wiring layer is formed in the interlayer insulating film of the third layer using photolithography, dry etching, and the like. During processing of the interlayer insulating film of the third layer, the interlayer insulating film that does not reach the second wiring layer 38b upon forming the via flag opening described above is also etched at the same time. Therefore, the via plug opening is completely opened and an upper surface of the second wiring layer 38b is exposed inside the via plug opening. Subsequently, by depositing a metal such as Cu so as to fill the opening using CVD, plating, and the like and planarizing the metal using CMP or the like, the via plug 39b of the second layer to be electrically connected to the second wiring layer 38b and the third wiring layer 38c are formed.

In a similar manner, an interlayer insulating film of a fourth layer is deposited on a wiring pattern of the formed third wiring layer 38c, the interlayer insulating film of the fourth layer is selectively opened, and a via plug opening (for a via plug 39c) is formed until just before a part of the wiring pattern of the third wiring layer 38c becomes exposed. After separating a photoresist, a wiring groove (trench) to be a fourth wiring layer is formed in the interlayer insulating film of the fourth layer using photolithography, dry etching, and the like. During processing of the interlayer insulating film of the fourth layer, the interlayer insulating film that does not reach the third wiring layer 38c upon forming the via flag opening described above is also etched at the same time. Therefore, the via plug opening is completely opened and an upper surface of the third wiring layer 38c is exposed inside the via plug opening. Subsequently, by depositing a metal such as Cu so as to fill the opening using CVD, plating, and the like and planarizing the metal using CMP or the like, the via plug 39c of the third layer to be electrically connected to the third wiring layer 38c and the fourth wiring layer 38d are formed. As a result, a multi-layer wiring structure is formed in which the wiring pattern of the second wiring layer 38b, the wiring pattern of the third wiring layer 38c, and the wiring pattern of the fourth wiring layer 38d are sequentially embedded on top of the wiring pattern of the first wiring layer 38a as shown in FIG. 9. While the formation of the multi-layer wiring structure has been described using a method in which, after the openings for the via plugs and the openings for wirings are formed, the metal is embedded at one time, alternatively, a method may be adopted in which the openings for wirings are formed after embedding the metal in the openings for via plugs.

As shown in FIG. 9, a source follower (SF) circuit is constructed by electrically connecting the charge storage region 15 of the first semiconductor layer (11 and 12), the amplifying transistors (33a, 33b, and 34) of the second semiconductor layer 31, and the reset transistor (not illustrated) to each other via the through via plug 21, the wiring pattern of the first wiring layer 38a, and the contact plug 36. One of the first main electrode region 33a and the second main electrode region 33b of the amplifying transistors (33a, 33b, and 34) is connected to a power supply line. In addition, the contact region 330 of the second semiconductor layer 31 and the contact region 220 of the well contact region 22 are connected to a grounding line. For convenience's sake, in the present disclosure, the first semiconductor layer (11 and 12) and the second semiconductor layer 31 that includes a pixel transistor and a wiring layer as shown in FIG. 9 are referred to as a "photoelectric conversion element unit".

Next, the third semiconductor layer 51 constituted by a new Si substrate that differs from the photoelectric conversion element unit shown in FIG. 9 is prepared for a logic circuit. In addition, a logic circuit is constructed on the third semiconductor layer 51 by an ordinary CMOS manufacturing step. In a similar manner to two transistors schematically illustrated in FIG. 10A that constitute a part of the logic circuit, a large number of transistors (hereinafter, referred to as "logic circuit transistors") 52 that constitute the logic circuit is formed in the third semiconductor layer 51 that constitutes the third substrate 5. The first main electrode region 53a and the second main electrode region 53b are arranged so as to be separated from each other in an upper part of the third semiconductor layer 51 of the third substrate 5 illustrated in FIG. 10A, and a gate electrode 54 is arranged via a gate insulating film (not illustrated) on the third semiconductor layer 51 between the first main electrode region 53a and the second main electrode region 53b. While the logic circuit transistor 52 is constituted by the gate electrode 54, the first main electrode region 53a, and the second main electrode region 53b, the gate electrode 54 is covered by the interlayer insulating film 55. An upper surface of the interlayer insulating film 55 has been planarized.

Figure 10A:
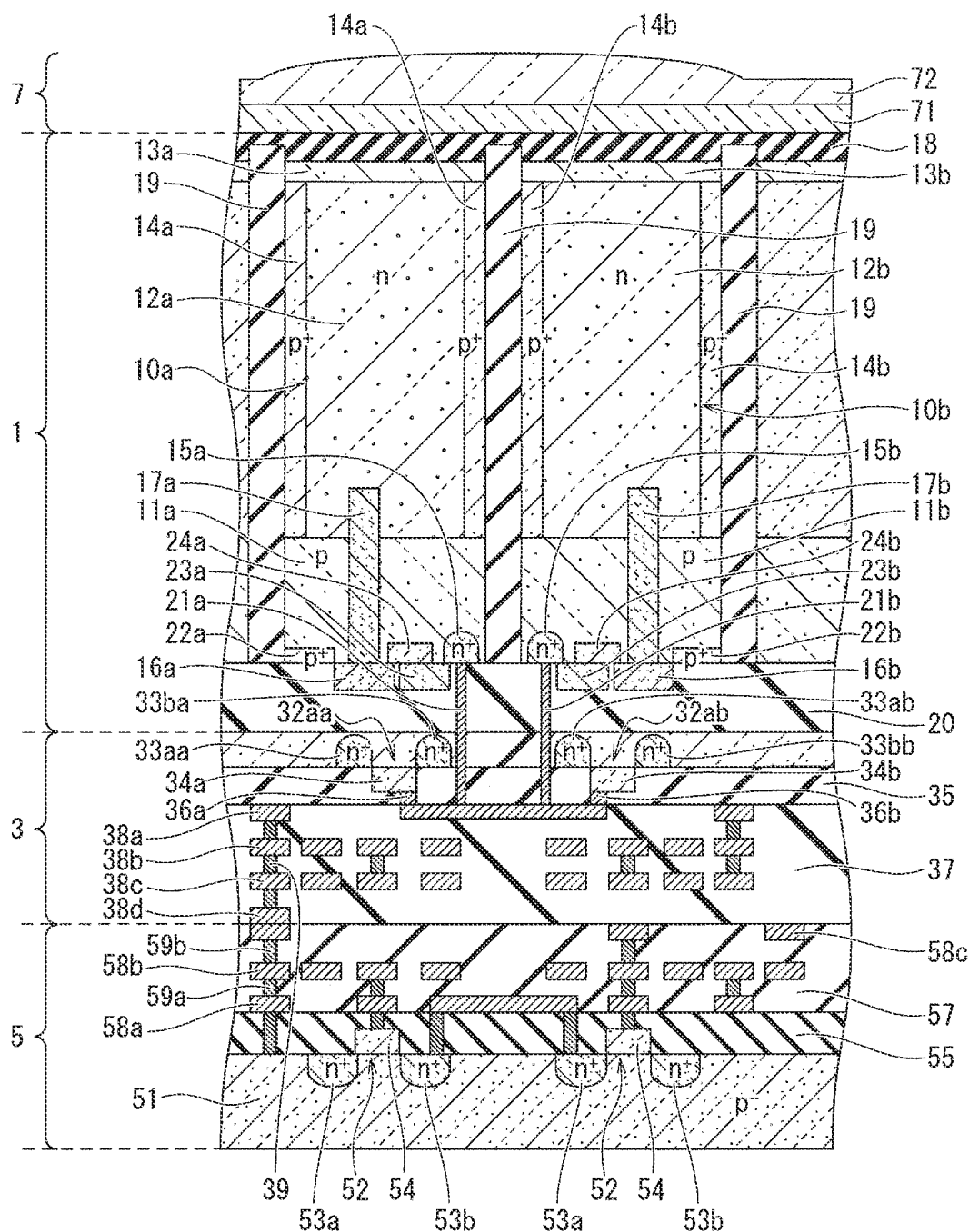
FIG. 10A is a schematic sectional view which is a continuation of FIG. 9 for explaining an example of a step of a manufacturing method of the solid-state imaging apparatus according to the first embodiment of the present disclosure.

Next, by CVD or the like, an interlayer insulating film of a first layer in which a first wiring layer is to be formed is deposited on the interlayer insulating film 55 illustrated in FIG. 10A. In addition, a groove (a trench) to be the first wiring layer is formed in the interlayer insulating film using photolithography and dry etching. Subsequently, after forming a barrier metal and a metal film such as seed Cu on an inner wall of the trench by sputtering or the like, Cu is deposited by electrolytic plating or the like so as to be completely embedded in the trench. Subsequently, by electrolytic polishing, CMP, or the like, Cu on the interlayer insulating film of the first layer is removed so that Cu only remains in the trench to form a wiring pattern of the first wiring layer 58a. An interlayer insulating film of a second layer is deposited on the wiring pattern of the first wiring layer 58a using CVD. In addition, the interlayer insulating film of the second layer is selectively opened using photolithography and dry etching and a via plug opening (for a via plug 59a) is formed until just before a part of the wiring layer of the first wiring layer 58a becomes exposed. After separating a photoresist of the present step, the interlayer insulating film of the second layer is processed and a wiring groove (trench) in which a metal of the second wiring layer 58b is to be embedded is formed using photolithography, dry etching, and the like. During processing of the interlayer insulating film of the second layer, the interlayer insulating film that does not reach the first wiring layer 58a upon forming the via flag opening described above is also etched at the same time. Therefore, an upper surface of the first wiring layer 58a is exposed inside the via plug opening.

Subsequently, by depositing a metal such as Cu so as to fill the opening using CVD, plating, and the like and planarizing the metal using CMP or the like, the via plug 59a of the first layer to be electrically connected to the second wiring layer 58b and the second wiring layer 58b are formed.

In a similar manner, an interlayer insulating film of a third layer is deposited on a wiring pattern of the formed second wiring layer 58b, the interlayer insulating film of the third layer is selectively opened, and a via plug opening (for a via plug 59b) is formed until just before a part of the wiring layer of the second wiring layer 58b becomes exposed. After separating a photoresist, a wiring groove (trench) to be a third wiring layer is formed in the interlayer insulating film of the third layer using photolithography, dry etching, and the like. During processing of the interlayer insulating film of the third layer, the interlayer insulating film that does not reach the second wiring layer 58b upon forming the via flag opening described above is also etched at the same time. Therefore, the via plug opening is completely opened and an upper surface of the second wiring layer 58b is exposed inside the via plug opening. Subsequently, by depositing a metal so as to fill the opening using CVD, plating, and the like and planarizing the metal using CMP or the like, the via plug 59b of the second layer to be electrically connected to the second wiring layer 58b and the third wiring layer 58c are formed. As a result, a multi-layer wiring structure is completed in which the first wiring layer 58a, the second wiring layer 58b, and the third wiring layer 58c are sequentially laminated in the interlayer insulating film 57 and an upper surface of the interlayer insulating film 57 is planarized as shown in FIG. 10A.

Figure 10B:
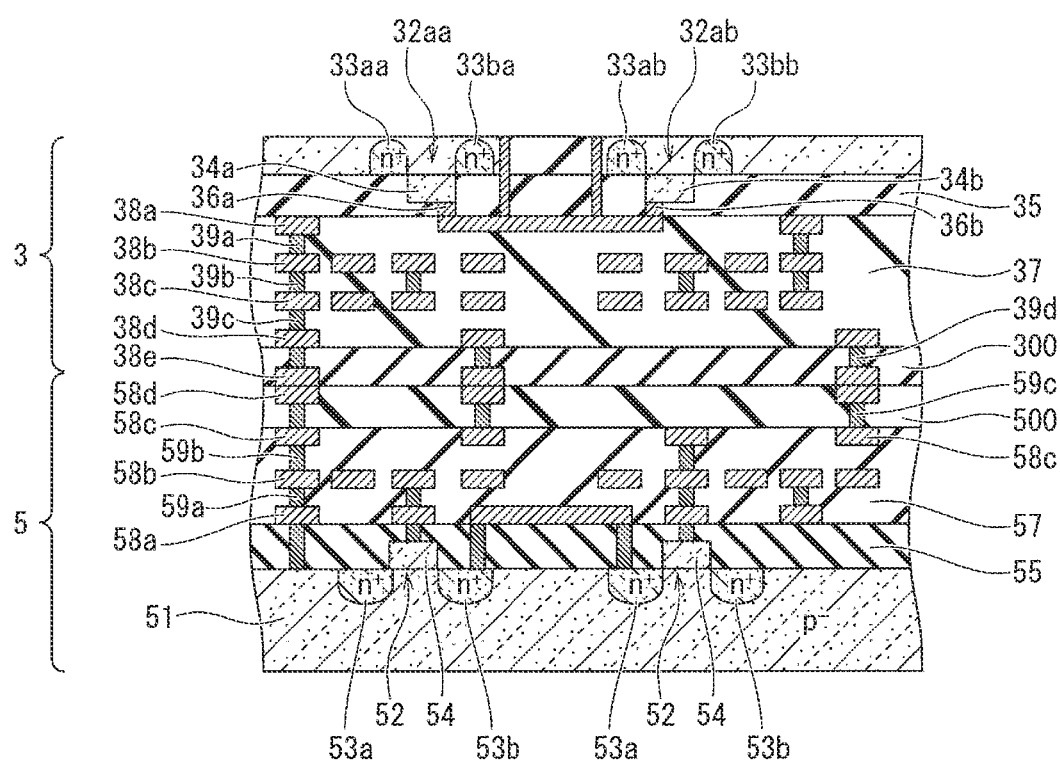
FIG. 10B is a schematic sectional view which is a continuation of FIG. 9 for explaining another example of a step of a manufacturing method of the solid-state imaging apparatus according to the first embodiment of the present disclosure.

A contact region using silicide and the like are formed in the third semiconductor layer 51 illustrated in FIG. 10A and connected to wirings of the logic circuit. In this manner, the third substrate 5 in which logic circuits are integrated in the third semiconductor layer 51 is prepared. Next, as shown in FIG. 10A, the third substrate 5 is bonded to the second substrate 3 via the interlayer insulating film 37 and the interlayer insulating film 57 using a wafer direct bonding technique. This bonding is performed by inverting photoelectric conversion element units such that a positional relationship among the third semiconductor layer 51, the second semiconductor layer 31, and the first semiconductor layer (11 and 12) is an arrangement in this order: the third semiconductor layer 51, the second semiconductor layer 31, and the first semiconductor layer (11 and 12). In this case, an example is shown in which the third substrate 5 and the photoelectric conversion element units are connected by a Cu—Cu connection and Cu—Cu bonding is performed by a wiring layer of each uppermost layer. While a direct Cu—Cu bonding is performed by respective wirings of the fourth wiring layer 38d of the second substrate 3 and the third wiring layer 58c of the third substrate 5 in FIG. 10A, alternatively, a structure may be adopted in which wiring layers for Cu—Cu bonding are separately provided. For example, as shown in FIG. 10B, a new interlayer insulating film 300 is deposited on a wiring layer of an uppermost layer of the second substrate 3 to form a via plug 39d of a fourth layer and a fifth wiring layer 38e which are made of Cu and which are electrically connected to the fourth wiring layer 38d. In addition, a new interlayer insulating film 500 is deposited on a wiring layer of an uppermost layer of the third substrate 5 to form a via plug 59c of a third layer and a fourth wiring layer 58d which are made of Cu and which are electrically connected to the third wiring layer 58c. Furthermore, Cu—Cu bonding may be performed between the fifth wiring layer 38e of the second substrate 3 and the fourth wiring layer 58d of the third substrate 5. Alternatively, oxide film bonding may be performed in which the interlayer insulating film 57 of the third substrate 5 and the interlayer insulating film 37 of the second substrate 3 are bonded to each other. In this case, a through silicon via (TSV) is to be formed in a step after thinning of the first substrate 1 to be subsequently performed and wirings of the third substrate 5 and the second substrate 3 are to be connected through the TSV. Subsequently, the first semiconductor layer (11 and 12) is thinned by grinding, polishing, and etching until the bottom pinning layer 13 with a desired thickness remains to form a light-receiving surface. While the film thickness of the first semiconductor layer (11 and 12) differs depending on applications and materials, when considering a transmission distance of visible light with generally-used Si, the thickness is around 1 µm to 10 µm.

The planarizing film 18 is formed on top of the bottom pinning layer 13 of the thinned first semiconductor layer (11 and 12) to be a light-receiving surface, and the color filter 71, the microlens 72, and the like are formed to complete the solid-state imaging apparatus shown in FIG. 10A. A light-shielding portion may be provided between pixels if necessary. Finally, an opening of a pad that is an input/output electrode for connecting a signal line, a power supply line, a grounding line, and the like to external wirings is formed. Although not illustrated, the pad need only be formed in any one of the third substrate 5 and the second substrate 3.

While an example in which three substrates, namely, the first substrate 1, the second substrate 3, and the third substrate 5 are bonded to each other, a silicide is formed in the third substrate 5, and the substrates are laminated has been shown in the description of the solid-state imaging apparatus according to the first embodiment, lamination is not limited to bonding three layers. For example, two substrates may be bonded to each other. In this case, a logic circuit in which a silicide is formed is to be formed in the second substrate 3. Alternatively, four or more layers may be laminated. In addition, while the circuit to be mounted to the third substrate 5 has been described using a general name "logic circuit", the third substrate 5 may be configured so as to include a logic circuit, a DRAM, a non-volatile memory, a MEMS, or the like and is not particularly limited.

Figure 11:
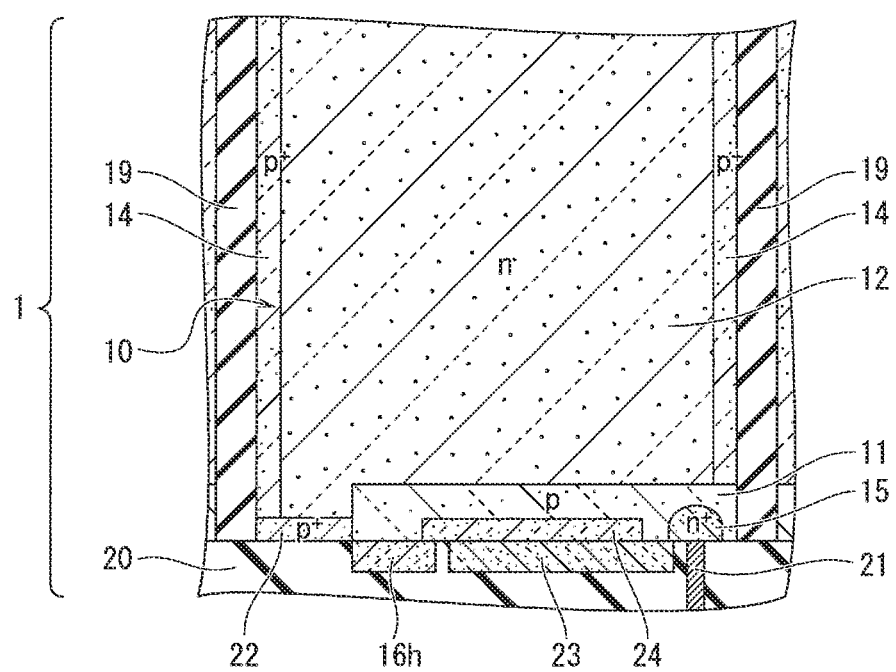
FIG. 11 is a schematic sectional view showing another example of the solid-state imaging apparatus according to the first embodiment of the present disclosure.
Figure 12:
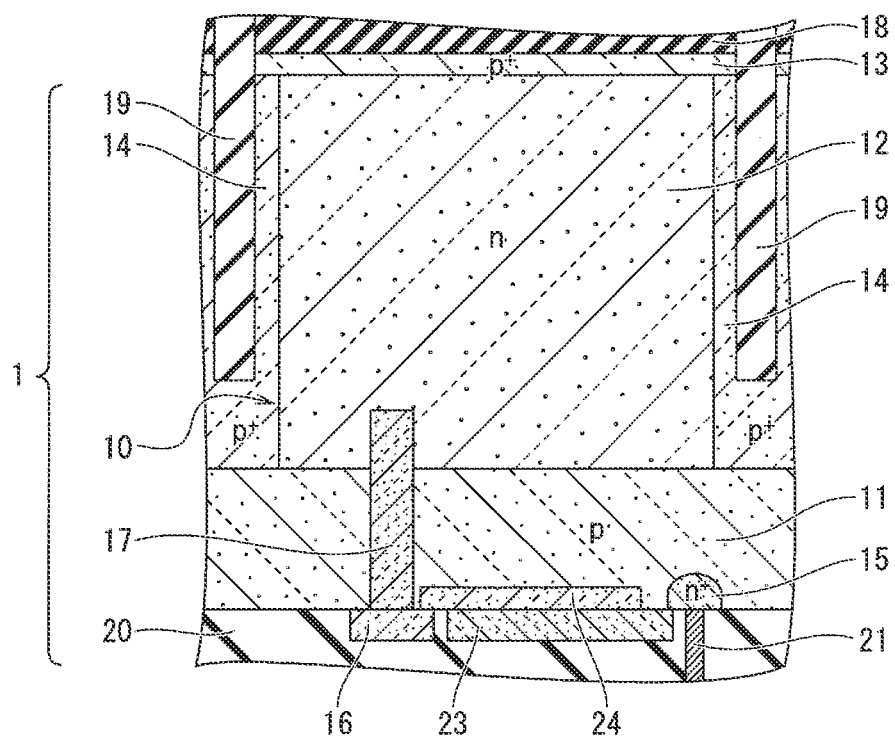
FIG. 12 is a schematic sectional view showing another example of the solid-state imaging apparatus according to the first embodiment of the present disclosure.

While the T-shaped transfer gate structure 16 having the vertical gate 17 has been exemplified in the description of the solid-state imaging apparatus according to the first embodiment, this component is not restrictive. For example, while the T-shaped transfer gate structure 16 is exemplified in the first embodiment, the vertical gate 17 may be the sole transfer gate structure or only a planer gate 16h such as that shown in FIG. 11 may be provided. Alternatively, the planer gate 16h and the vertical gate 17 may be separately provided and formed so that mutual transfer paths are connected to each other. When only the planer gate 16h is used as shown in FIG. 11, desirably, the p$^+$-type well contact region 22 as a pinning layer is formed to make the well region 11 shallow so that storage of charges does not decline. In addition, the pixel separating unit 19 need not completely separate pixels. For example, as shown in FIG. 12, a terminal may be provided in the charge generation region 12 separated from the well region 11.

Figure 13:
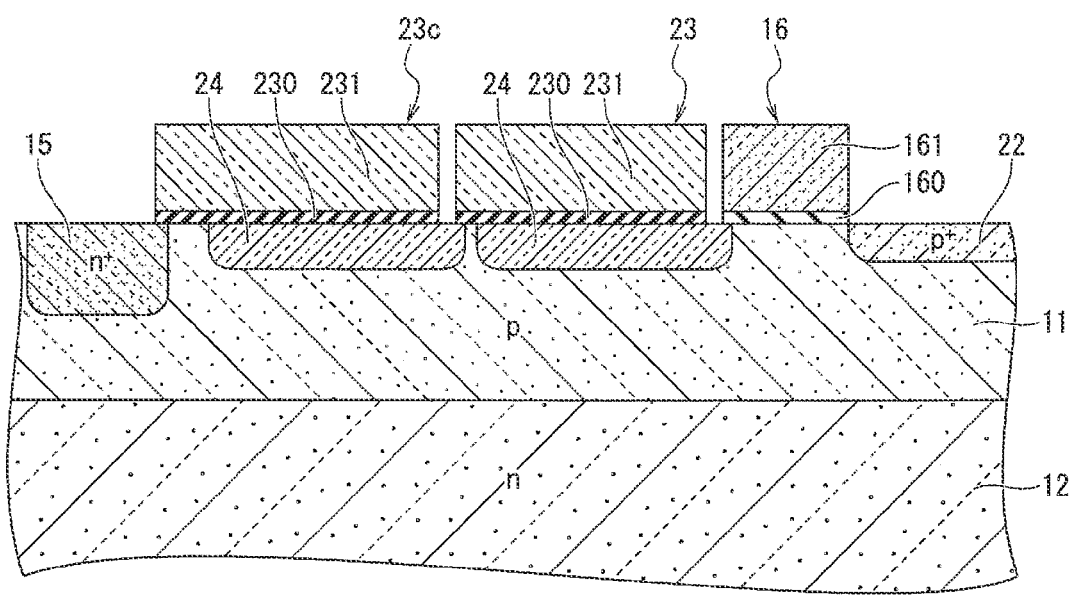
FIG. 13 is a schematic sectional view showing another example of the solid-state imaging apparatus according to the first embodiment of the present disclosure.

While a single charge holding unit 23 has been described above, this configuration is not restrictive. For example, as shown in FIG. 13, a plurality of charge holding units may be provided by providing a separate charge holding unit 23c between the charge holding unit 23 and the charge storage region 15. For example, a signal charge stored by incident light is temporarily held by the charge holding unit 23, the signal charge is next transferred to the charge holding unit 23c, and the signal charge is temporarily held by the charge holding unit 23c. In this manner, a transfer operation of a signal charge that is similar to that of a charge-coupled device can be performed.

Figure 14:
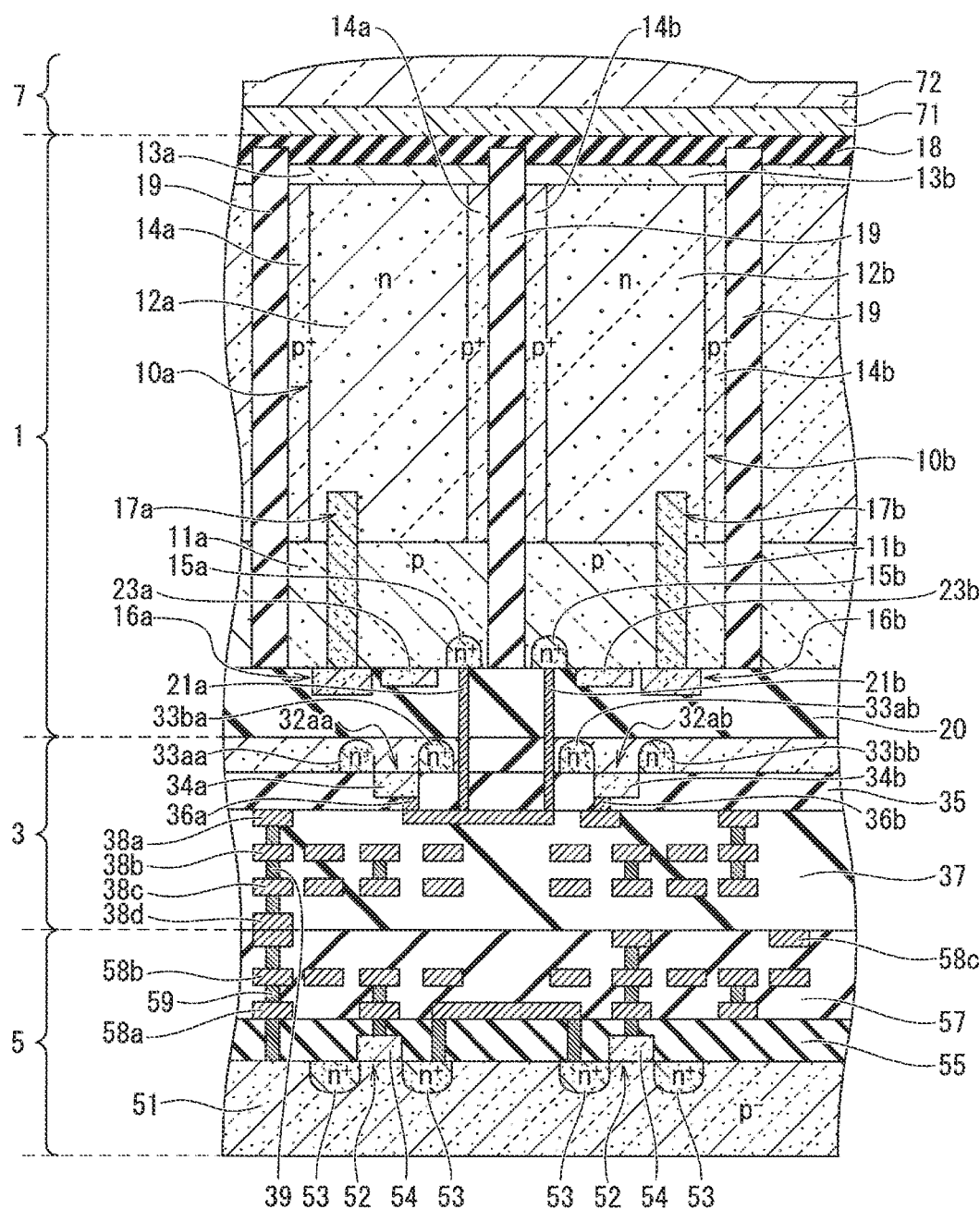
FIG. 14 is a schematic sectional view showing an example corresponding to 2 pixels of 2×2-pixel sharing of a solid-state imaging apparatus according to a second modification of the first embodiment of the present disclosure.

In addition, FIG. 14 shows pixels of two horizontal columns in a case where the pixels according to the first embodiment are constituted by 2×2 pixel sharing. As shown in FIG. 14, in a first pixel, a first photoelectric conversion unit 10a made up of a first well region 11a and a first charge generation region 12a is provided so as to be surrounded by a first bottom pinning layer 13a, a first side pinning layer 14a, and the first well region 11a. A first transfer gate structure 16a is provided on an upper surface of the first well region 11a, and a first vertical gate 17a is provided so as to penetrate the first well region 11a and reach the first charge generation region 12a. A first charge holding unit 23a is provided between the first transfer gate structure 16a and a first charge storage region 15a. The second semiconductor layer 31 of the second substrate 3 is provided with a pixel transistor such as an amplifying transistor 32aa having a first main electrode region 33aa, a second main electrode region 33ba, and a first gate electrode 34a. The first charge storage region 15a is electrically connected to the first gate electrode 34a through a first through via plug 21a, a wiring pattern of the first wiring layer 38a of the second substrate 3, and a contact plug 36a.

As shown in FIG. 14, in a second pixel, a second photoelectric conversion unit 10b made up of a second well region 11b and a second charge generation region 12b is provided so as to be surrounded by a second bottom pinning layer 13b, a second side pinning layer 14b, and the second well region 11b. A second transfer gate structure 16b is provided on an upper surface of the second well region 11b, and a second vertical gate 17b is provided so as to penetrate the second well region 11b and reach the second charge generation region 12b. A second charge holding unit 23b is provided between the second transfer gate structure 16b and a second charge storage region 15b. The second semiconductor layer 31 of the second substrate 3 is provided with a pixel transistor such as an amplifying transistor 32ab having a first main electrode region 33ab, a second main electrode region 33bb, and a second gate electrode 34b. The second charge storage region 15b is electrically connected to the second gate electrode 34b of the amplifying transistor 32aa through a second through via plug 21b, the wiring pattern of the first wiring layer 38a, and the contact plug 36a. It should be noted that the first pixel, the second pixel, a third pixel (not illustrated), and a fourth pixel (not illustrated) are separated by the pixel separating unit 19.

Figure 15:
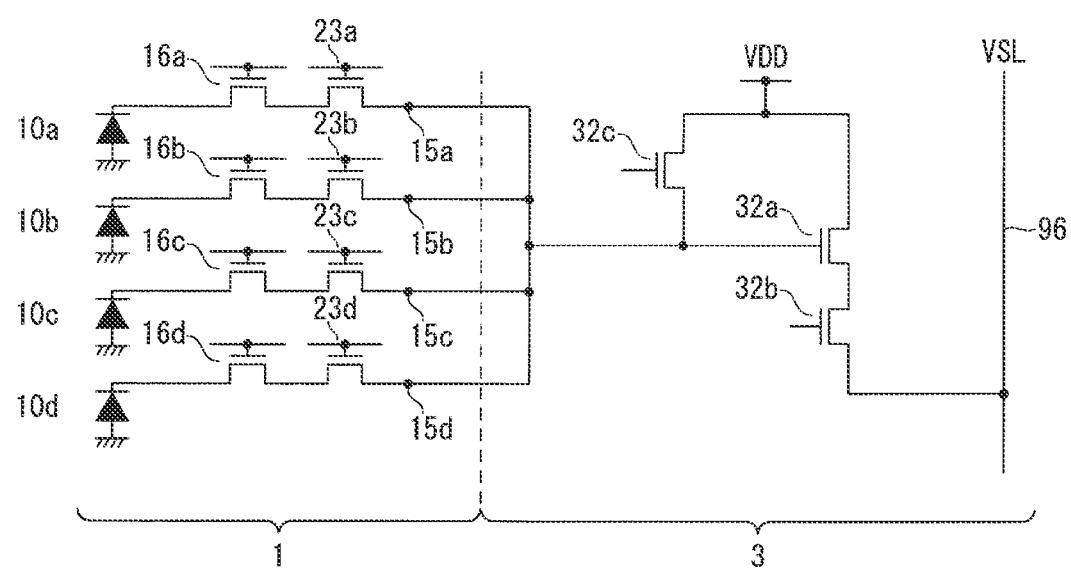
FIG. 15 is a diagram showing an example of an equivalent circuit of a pixel of the solid-state imaging apparatus shown in FIG. 14.

FIG. 15 shows an equivalent circuit of the solid-state imaging apparatus shown in FIG. 14. As shown in FIG. 15, inside the first substrate 1, signal charges stored by the first photoelectric conversion unit 10a, the second photoelectric conversion unit 10b, a third photoelectric conversion unit 10c, and a fourth photoelectric conversion unit 10d are respectively temporarily held by the first charge holding unit 23a, the second charge holding unit 23b, a third charge holding unit 23c, and a fourth charge holding unit 23d via the first transfer gate structure 16a, the second transfer gate structure 16b, a third transfer gate structure 16c, and a fourth transfer gate structure 16d. Held charges are respectively transferred to the first charge storage region 15a, the second charge storage region 15b, a third charge storage region 15c, and a fourth charge storage region 15d at prescribed timings to be converted into electric signals. In the second substrate 3, the converted electric signals are collectively transferred to the amplifying transistor 32a and the reset transistor 32c. The electric signals are sent to a VSL via the selective transistor 32b at prescribed timings.

Figure 16:
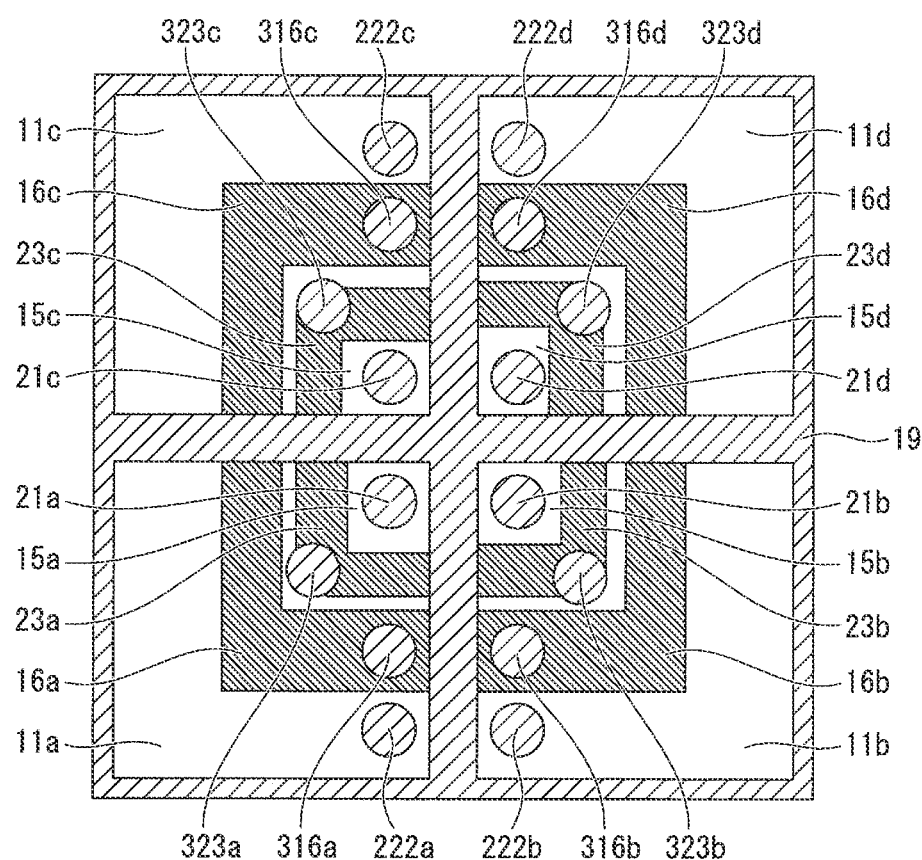
FIG. 16 is a diagram showing an example of a layout of a pixel of the solid-state imaging apparatus shown in FIG. 14.

FIG. 16 is a plan view showing a layout of the first substrate 1 of a 4-pixel sharing portion of 2×2 pixels. FIG. 16 also shows a connecting conductor for wiring. As shown in FIG. 16, a first through via plug 222a, a second through via plug 222b, a third through via plug 222c, and a fourth through via plug 222d are respectively connected to the first well region 11a, the second well region 11b, a third well region 11c, and a fourth well region 11d that are separated by the pixel separating unit 19. A first contact plug 316a, a second contact plug 316b, a third contact plug 316c, and a fourth contact plug 316d are respectively connected to the first transfer gate structure 16a, the second transfer gate structure 16b, the third transfer gate structure 16c, and the fourth transfer gate structure 16d. A first contact plug 323a, a second contact plug 323b, a third contact plug 323c, and a fourth contact plug 323d are respectively connected to the first charge holding unit 23a, the second charge holding unit 23b, the third charge holding unit 23c, and the fourth charge holding unit 23d. The first through via plug 21a, the second through via plug 21b, a third through via plug 21c, and a fourth through via plug 21d are respectively connected to the first charge storage region 15a, the second charge storage region 15b, the third charge storage region 15c, and the fourth charge storage region 15d.

Figure 17:
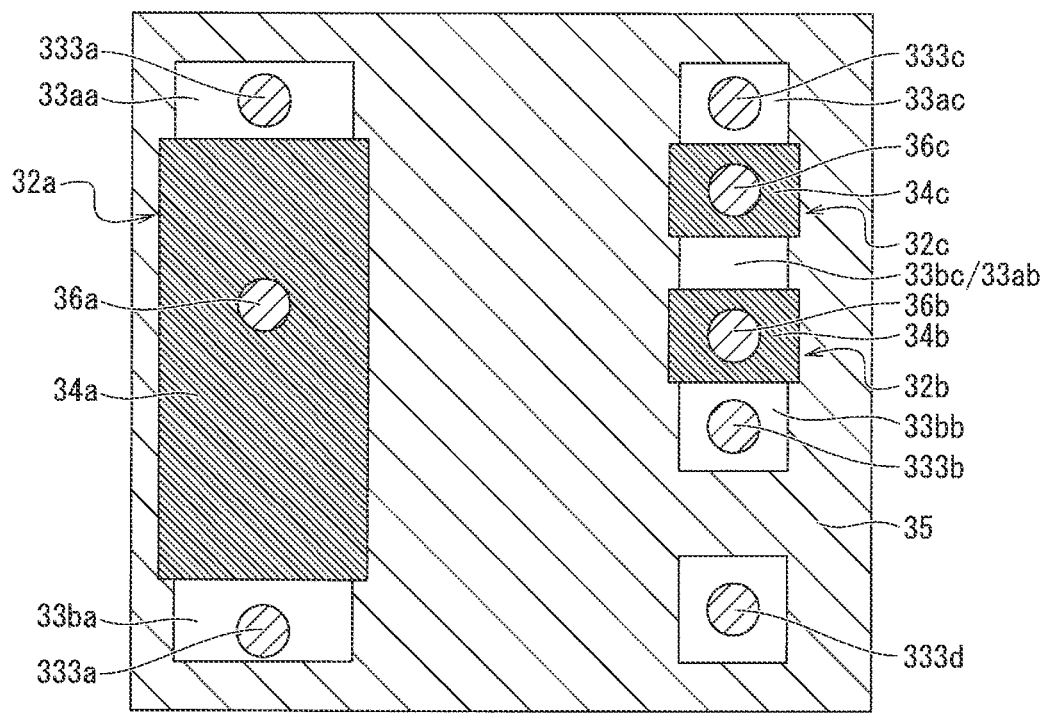
FIG. 17 is a diagram showing an example of a layout of a pixel transistor of the solid-state imaging apparatus shown in FIG. 14.
Figure 18:
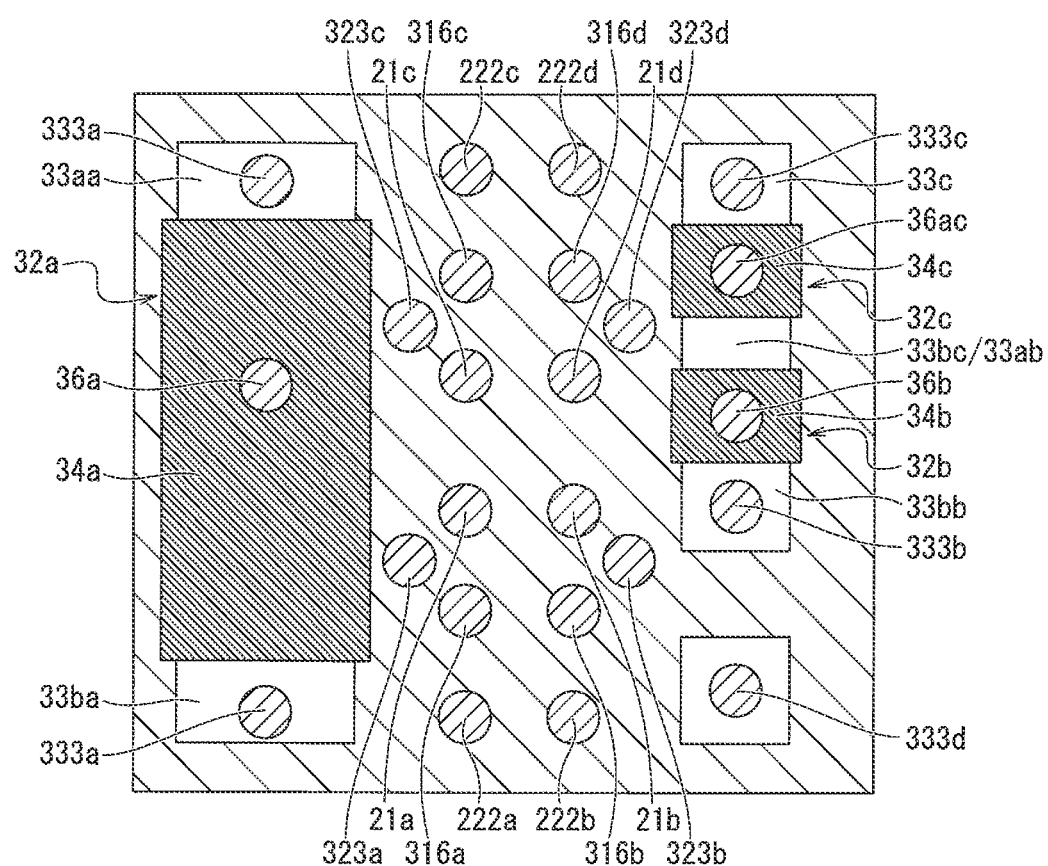
FIG. 18 is a diagram showing a superposition of the layouts shown in FIGS. 16 and 17.

FIG. 17 is a plan view showing a layout of the second substrate 3 and also showing a connecting conductor for wiring. As shown in FIG. 17, in the amplifying transistor 32a, a contact plug 333a is connected to two regions, that is, the first main electrode region 33aa and the second main electrode region 33ba and the contact plug 36a is connected to the first gate electrode 34a. In the selective transistor 32b, a contact plug 333b is connected to the first main electrode region 33ab and the second main electrode region 33bb and a contact plug 36b is connected to the second gate electrode 34b. In the reset transistor 32c, a contact plug 333c is connected to the first main electrode region 33ac and the second main electrode region 33bc and a contact plug 36c is connected to a gate electrode 34c. A contact plug 333d is a node for connecting the amplifying transistor 32a and the selective transistor 32b to each other. In reality, the pixel transistors (32a, 32b, and 32c) are covered by the interlayer insulating film 35. FIG. 18 represents a layout of through via plugs, contact plugs, and pixel transistors in which the first substrate 1 shown in FIG. 16 and the second substrate 3 shown in FIG. 17 are superimposed on each other.

Figure 19:
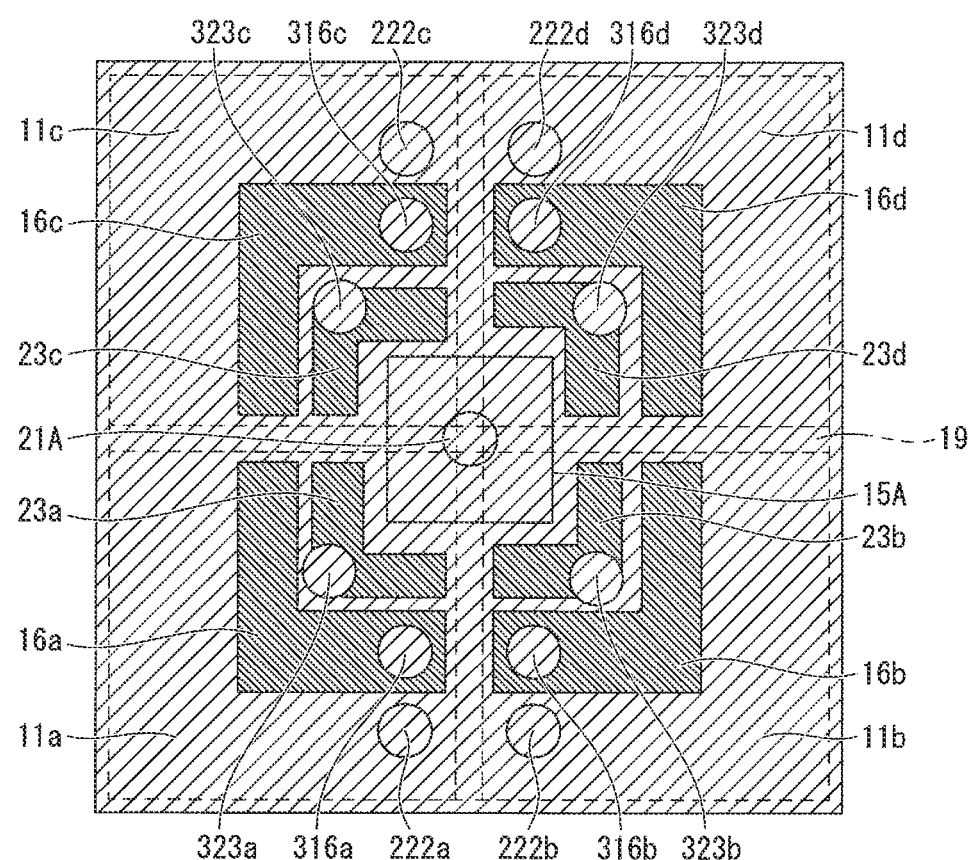
FIG. 19 is a diagram showing an example of a layout of pixels corresponding to 2 pixels when a charge storage region is to be shared in 2×2-pixel sharing using a structure of the solid-state imaging apparatus shown in FIG. 12.

In FIGS. 16 to 18, each pixel is separated by the pixel separating unit 19. In the description of the solid-state imaging apparatus according to the first embodiment, using the pixel separating unit 19 shown in FIG. 12 enables a charge storage region to be shared without separating the first to fourth well regions 11a to 11d. FIG. 19 represents a layout of the first substrate 1 when sharing a charge storage region 15A. As shown in FIG. 19, the first to fourth well regions 11a to 11d are not separated by the pixel separating unit 19. The charge storage region 15A is provided in a central part where the four pixels intersect each other. A through via plug 21A is connected to the charge storage region 15A in the central part. The first to fourth contact plugs 316a to 316d are respectively connected to the first to fourth transfer gate structures 16a to 16d, and the first to fourth contact plugs 323a to 323d are respectively connected to the first to fourth charge holding units 23a to 23d. Charges transferred from the first to fourth transfer gate structures 16a to 16d to the first to fourth charge holding units 23a to 23d and held therein are transferred to the charge storage region 15A in the central part.

Figure 20:
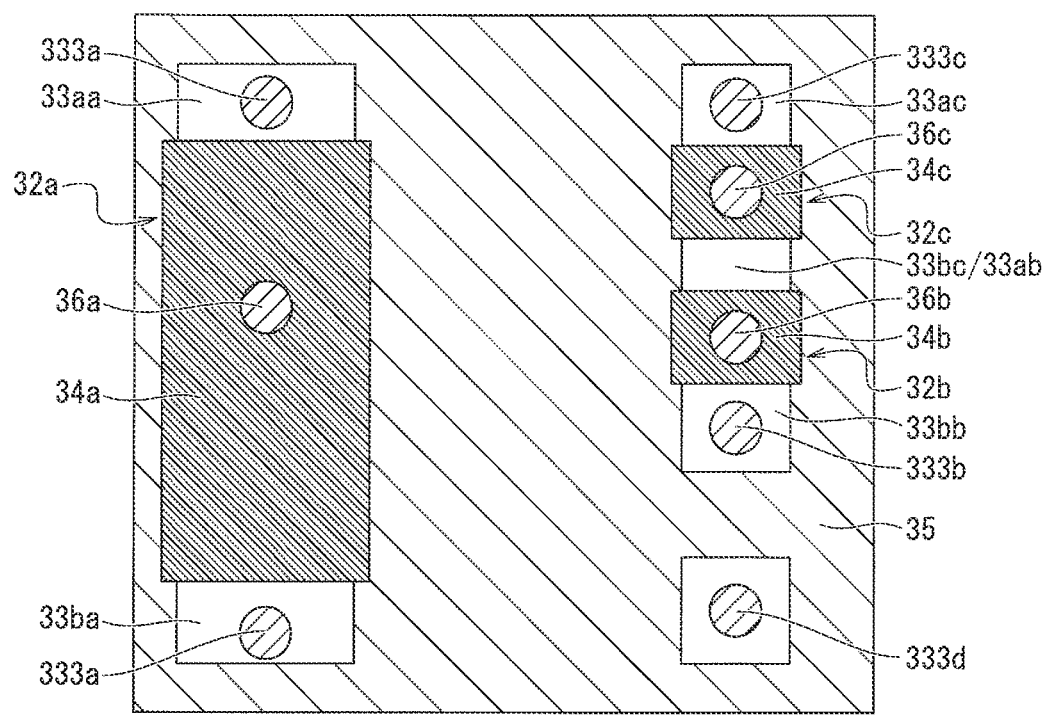
FIG. 20 is a diagram showing an example of a layout of pixel transistors corresponding to 2 pixels when a charge storage region is to be shared in 2×2-pixel sharing using a structure of the solid-state imaging apparatus shown in FIG. 12.
Figure 21:
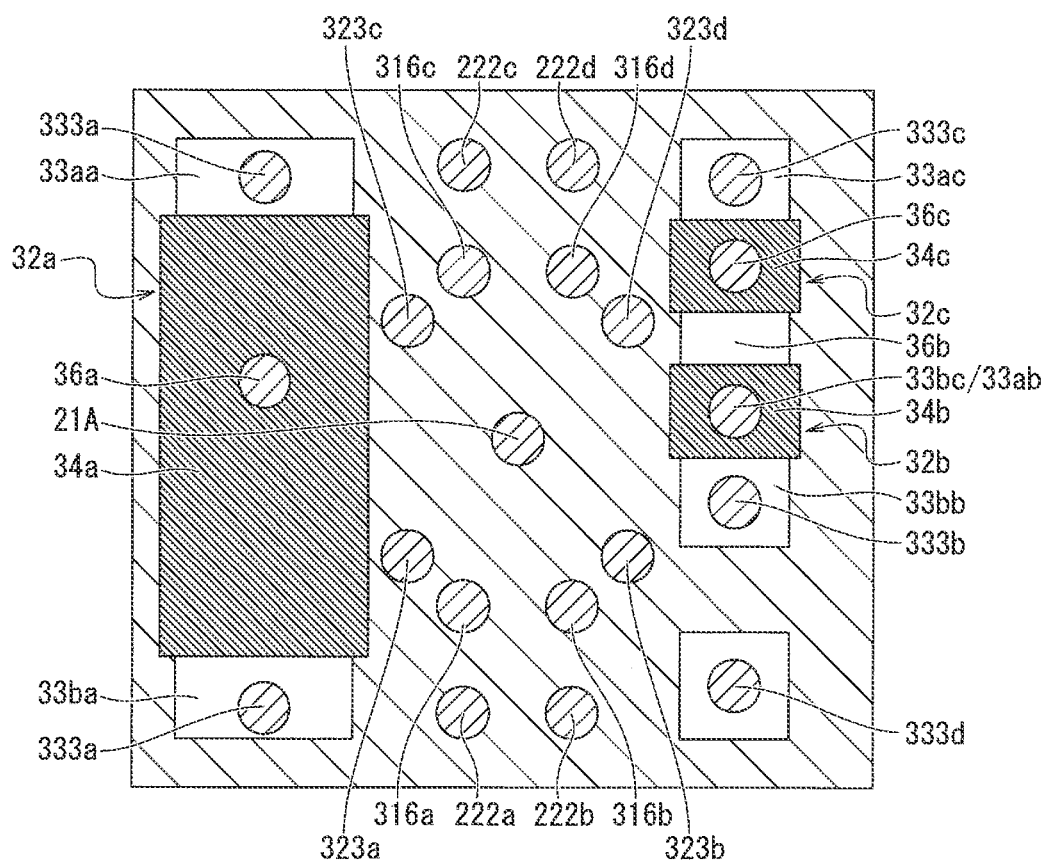
FIG. 21 is a diagram showing a superposition of the layouts shown in FIGS. 19 and 20.

FIGS. 20 and 21 represent a layout of the second substrate 3 and a superposition of the first substrate 1 and the second substrate 3 when sharing the charge storage region 15A shown in FIG. 19. As shown in FIG. 20, the layout of the second substrate 3 is similar to that shown in FIG. 17. In addition, as shown in FIG. 21, the layout of the superposition of the first substrate 1 and the second substrate 3 only differs from the layout shown in FIG. 18 in that only one through via plug 21A is connected to the charge storage region 15A. In this manner, by sharing the charge storage region 15A, layouts can be simplified and connecting conductors can be readily formed.

Second Embodiment

Figure 22:
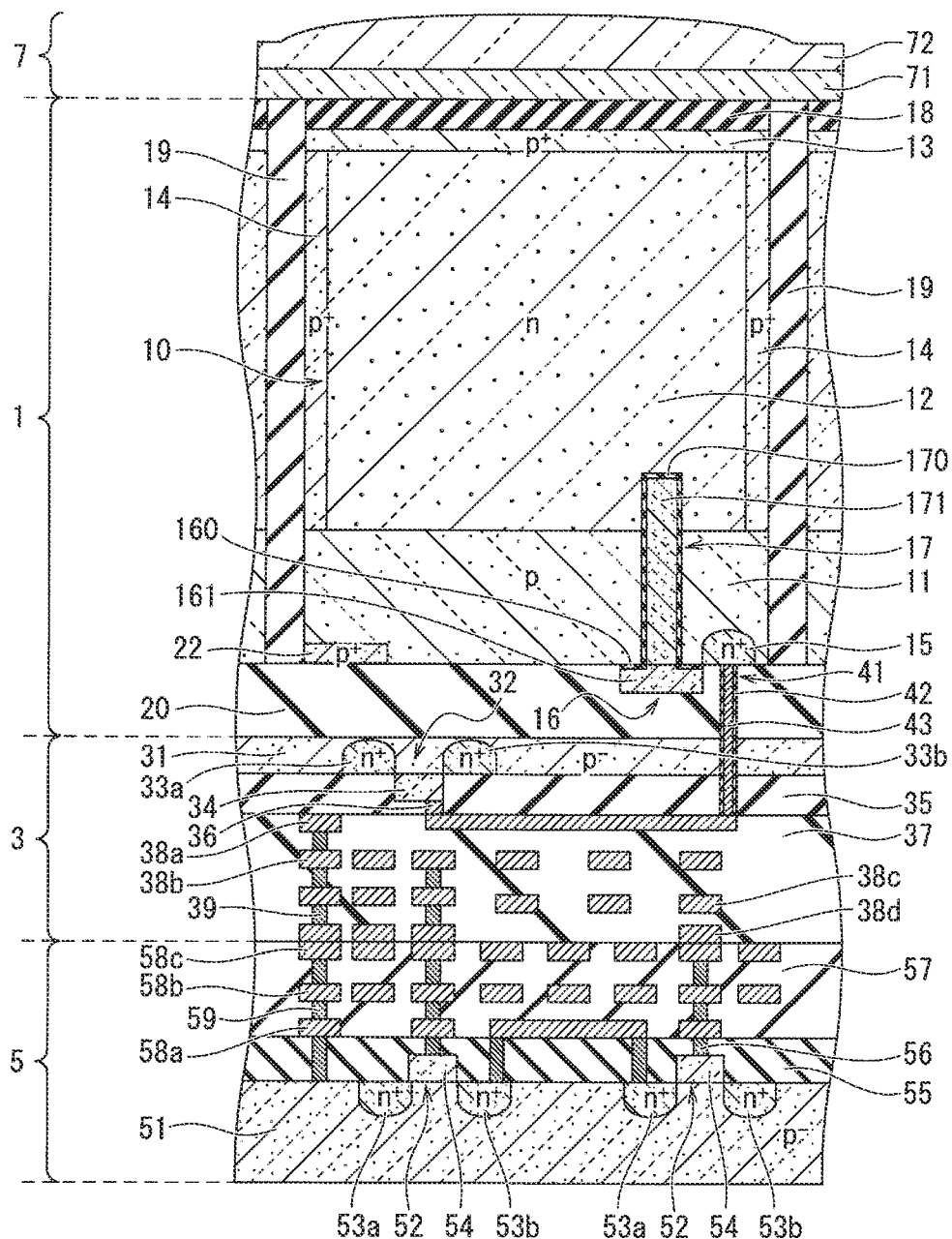
FIG. 22 is a schematic sectional view showing an example of a solid-state imaging apparatus according to a second embodiment of the present disclosure.

As shown in FIG. 22, a solid-state imaging apparatus according to a second embodiment of the present disclosure includes a through connecting conductor 43 made of a metal such as Cu, W, or the like to be electrically connected to a charge storage region 15 and a charge holding unit 41 with a capacitor structure and having an insulating film 42 made of a dielectric film that covers a surface of the through connecting conductor 43. The through connecting conductor 43 is a through via plug that is connected to a gate electrode 34 of a pixel transistor 32 such as an amplifying transistor through a wiring pattern of a first wiring layer 38a formed in an interlayer insulating film 37 of a second substrate 3 and a contact plug 36. The charge holding unit 41 is formed in a second semiconductor layer 31 of the second substrate 3 so as to come into contact with the insulating film 42. In this case, a wiring capacitance $C_V$ of the charge holding unit 41 is expressed by $C_V = \varepsilon \cdot S/d$, where $\varepsilon$ denotes a dielectric constant of the insulating film 42, S denotes a surface area of the through connecting conductor 43 that is metal, and d denotes a distance between the through connecting conductor 43 and the second semiconductor layer 31. In the example shown in FIG. 22, the distance d between the through connecting conductor 43 that is a through via plug and the second semiconductor layer 31 is a film thickness of the insulating film 42. In addition, the surface area S can be adjusted by changing a shape of the through connecting conductor 43. Furthermore, the surface area S can also be adjusted by a dielectric constant of a dielectric body material. A capacitance of a portion where the charge holding unit 41 of the insulating film 42 comes into contact with an interlayer insulating film 20 and an interlayer insulating film 35 becomes extremely small. Therefore, the wiring capacitance $C_V$ of the charge holding unit 41 is determined by a portion where the charge holding unit 41 comes into contact with the second semiconductor layer 31.

Figure 23:
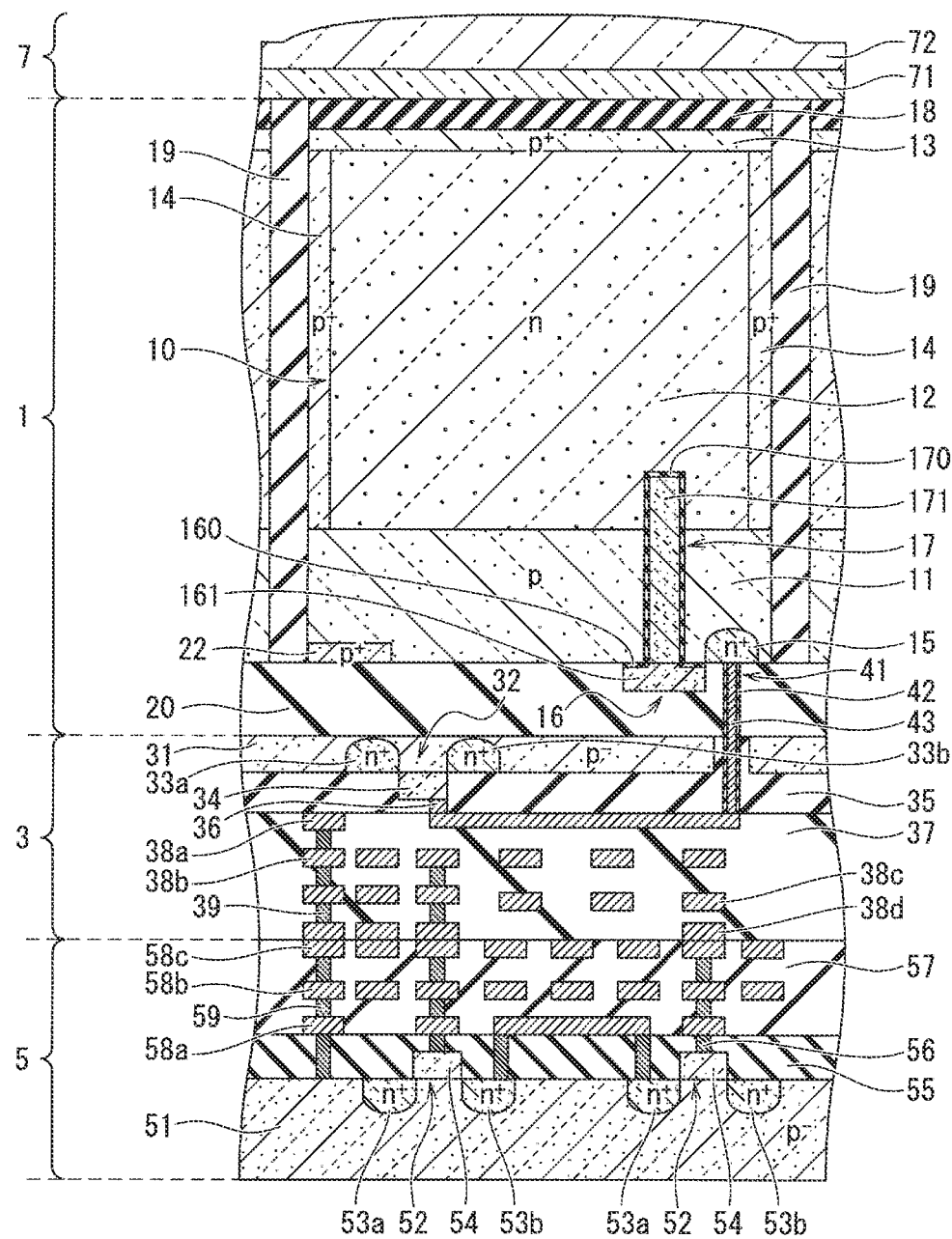
FIG. 23 is a schematic sectional view showing another example of the solid-state imaging apparatus according to the second embodiment of the present disclosure.

Alternatively, as shown in FIG. 23, the charge holding unit 41 may be configured to penetrate the interlayer insulating film 35 and not come into contact with the second semiconductor layer 31. In this case, the wiring capacitance $C_V$ of the charge holding unit 41 is given by a series connection of a capacitance due to the insulating film 42 in a region where the through connecting conductor 43 faces the second semiconductor layer 31 and a capacitance due to the interlayer insulating film 35. Therefore, the wiring capacitance $C_V$ of the charge holding unit 41 can be adjusted by selecting a dielectric constant or a thickness of the insulating film 42.

In the solid-state imaging apparatus, parameters that govern photoelectric conversion efficiency include a parasitic capacitance $C_{FD}$ of a charge storage region. The photoelectric conversion efficiency to voltage in the charge storage region varies depending on the parasitic capacitance $C_{FD}$ of the charge storage region. Generally, conversion efficiency is inversely proportional to the parasitic capacitance $C_{FD}$. Reducing the parasitic capacitance $C_{FD}$ enables conversion efficiency to be increased, sensitivity to be improved, and a high SN ratio to be realized. Increasing the parasitic capacitance $C_{FD}$ reduces conversion efficiency and enables operations to be performed under high illuminance and a dynamic range to be increased. Therefore, using the parasitic capacitance $C_{FD}$ of the charge storage region 15 and the wiring capacitance $C_V$ of the charge holding unit 41 enables an effective capacitance $C_{EFF}$ of the charge storage region 15 to be adjusted across a wide range. Therefore, conversion efficiency can be adjusted across a wide range and, at the same time, a dynamic range can also be adjusted. Furthermore, in a similar manner to the solid-state imaging apparatus according to the first embodiment, providing a capacitor electrode in a part of the charge holding unit 41 can make the wiring capacitance $C_V$ of the charge holding unit 41 variable according to a magnitude of a voltage to be applied to the capacitor electrode.

Next, with reference to FIGS. 24 to 26, a manufacturing method of the solid-state imaging apparatus according to the second embodiment will be described with a main focus on an example of a forming step of the charge holding unit 41. It should be noted that the forming method of the charge holding unit 41 described below is merely an example and formation of the charge holding unit 41 can be realized by various other manufacturing methods including modifications of the manufacturing method described below within the purport described in the scope of claims.

Figure 24:
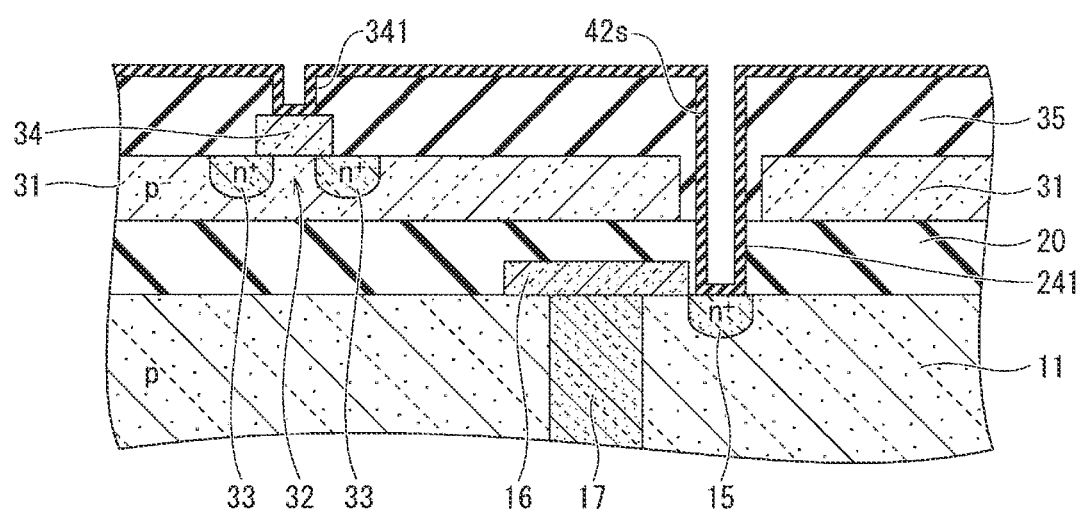
FIG. 24 is a schematic sectional view for explaining an example of a step of a manufacturing method of the solid-state imaging apparatus shown in FIG. 23.

As shown in FIG. 24, an opening 241 is formed by photolithography, RIE, and the like so as to penetrate the interlayer insulating film 35 and the interlayer insulating film 20 without coming into contact with the second semiconductor layer 31 and to reach the charge storage region 15 formed in the well region 11. At the same time, an opening 341 that penetrates the interlayer insulating film 35 and reaches the gate electrode 34 of the pixel transistor 32 is formed. Subsequently, an insulating film 42s is deposited on bottom surfaces and side surfaces of the openings 241 and 341 and a surface of the interlayer insulating film 35. Subsequently, the insulating film 42s formed in bottom portions of the openings 241 and 341 is removed by etchback.

Figure 25:
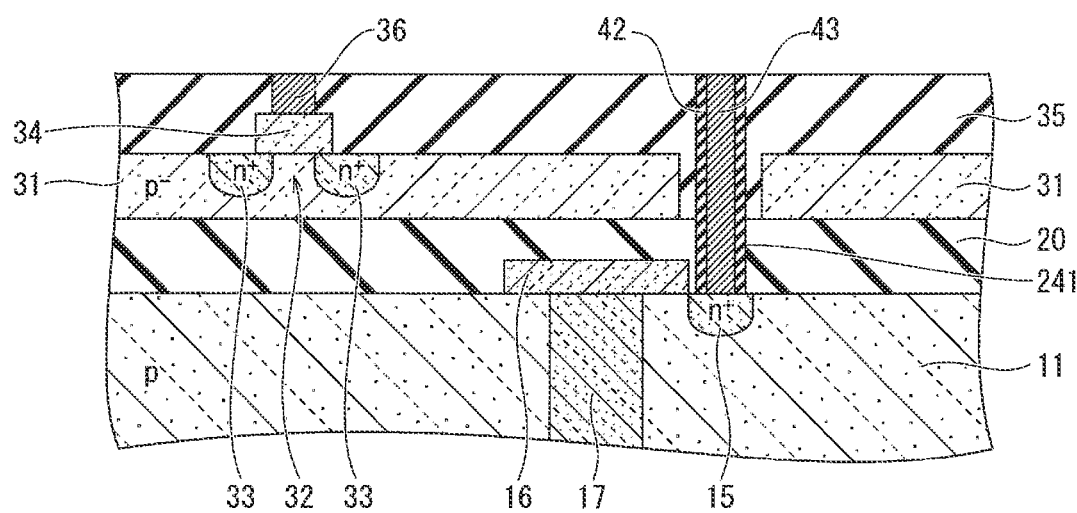
FIG. 25 is a schematic sectional view which is a continuation of FIG. 24 for explaining an example of a step of the manufacturing method of the solid-state imaging apparatus shown in FIG. 23.

As shown in FIG. 25, the through connecting conductor 43 made of a conductor such as W is embedded into the opening 241 via the insulating film 42 using CVD, chemical mechanical polishing (CMP), and the like. In the opening 341, the contact plug 36 that is a conductor is embedded and electrically connected to the gate electrode 34.

Figure 26:
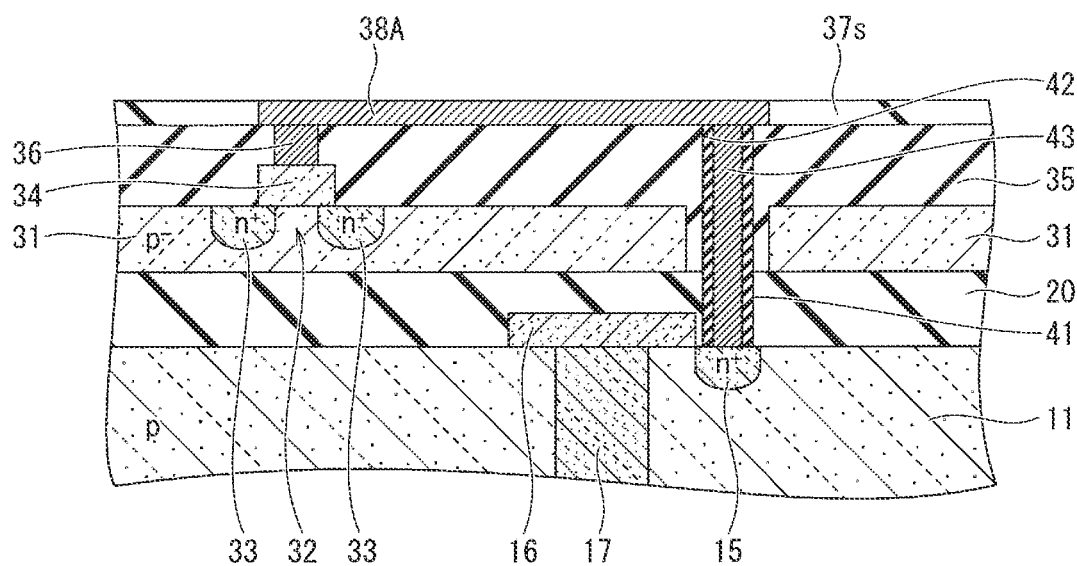
FIG. 26 is a schematic sectional view which is a continuation of FIG. 25 for explaining an example of a step of the manufacturing method of the solid-state imaging apparatus shown in FIG. 23.

As shown in FIG. 26, a wiring pattern of a first wiring layer 38A having been embedded in an opening provided in an interlayer insulating film 37s is provided so as to be electrically connected to the through connecting conductor 43 of the charge holding unit 41 and the gate electrode 34 of the pixel transistor 32. In this manner, a parasitic capacitance $C_{FD}$ of the charge storage region 15 and a wiring capacitance $C_V$ of the charge holding unit 41 can be formed.

Figure 27:
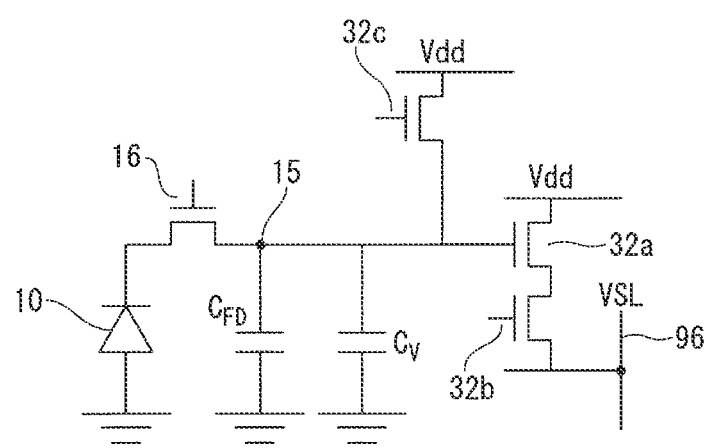
FIG. 27 is a diagram showing an example of an equivalent circuit of a pixel of the solid-state imaging apparatus according to the second embodiment of the present disclosure.

FIG. 27 shows an equivalent circuit of the solid-state imaging apparatus according to the second embodiment. As shown in FIG. 27, the parasitic capacitance $C_{FD}$ of the charge storage region 15 and the wiring capacitance $C_V$ of the charge holding unit 41 are connected in parallel in the charge storage region 15. Conversion efficiency can be adjusted by adjusting the wiring capacitance $C_V$. For example, the effective capacitance $C_{EFF}$ can be adjusted by using a high dielectric constant material and a low dielectric constant material on the basis of a $SiO_2$ film as the insulating film 42 of the charge holding unit 41. Alternatively, the effective capacitance $C_{EFF}$ can also be adjusted by appropriately selecting a film thickness of the insulating film 42.

Figure 28:
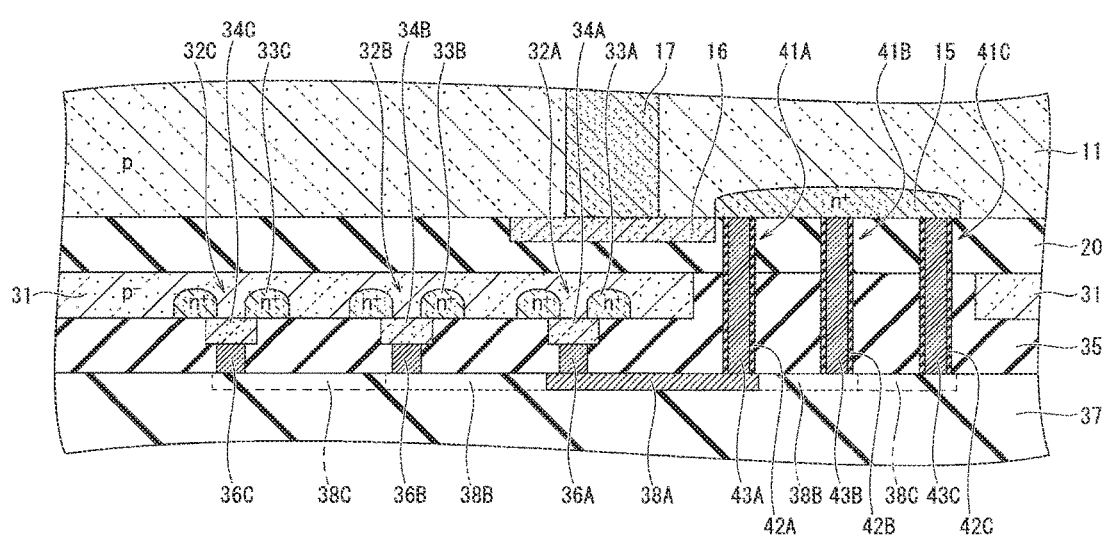
FIG. 28 is a schematic sectional view showing an example of a solid-state imaging apparatus according to a first modification of the second embodiment of the present disclosure.

While the effective capacitance $C_{EFF}$ is adjusted using a single charge holding unit 41 in the description given above, the effective capacitance $C_{EFF}$ cannot be changed after being manufactured. For example, as shown in FIG. 28, each of a plurality of charge holding units 41A, 41B, and 41C that are electrically connected to the charge storage region 15 may be given different effective capacitances $C_{EFF}$. For example, an insulating film 42A made of a high dielectric constant material is used in the charge holding unit 41A, an insulating film 42B that is a standard $SiO_2$ film is used in the charge holding unit 41B, and an insulating film 42C made of a low dielectric constant material is used in the charge holding unit 41C. A through connecting conductor 43A of the charge holding unit 41A is connected to a gate electrode 34A of a pixel transistor 32A via a wiring pattern of the first wiring layer 38A and a contact plug 36A. A through connecting conductor 43B of the charge holding unit 41B is connected to a gate electrode 34B of a pixel transistor 32B via a wiring pattern of a second wiring layer 38B and a contact plug 36B. A through connecting conductor 43C of the charge holding unit 41C is connected to a gate electrode 34C of a pixel transistor 32C via a wiring pattern of a third wiring layer 38C and a contact plug 36C. By appropriately selecting the pixel transistors 32A, 32B, and 32C according to control of a logic circuit, the effective capacitance $C_{EFF}$ can be adjusted. Alternatively, film thicknesses of the insulating films 42A, 42B, and 42C may be varied instead of dielectric constants.

Figure 29:
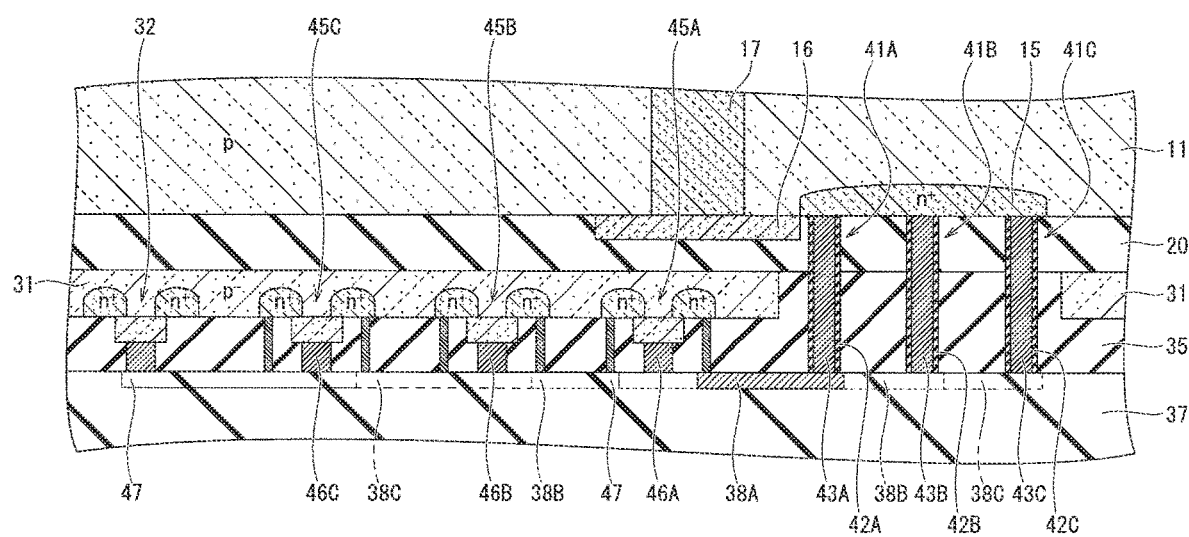
FIG. 29 is a schematic sectional view showing an example of a solid-state imaging apparatus according to a second modification of the second embodiment of the present disclosure.
Figure 30:
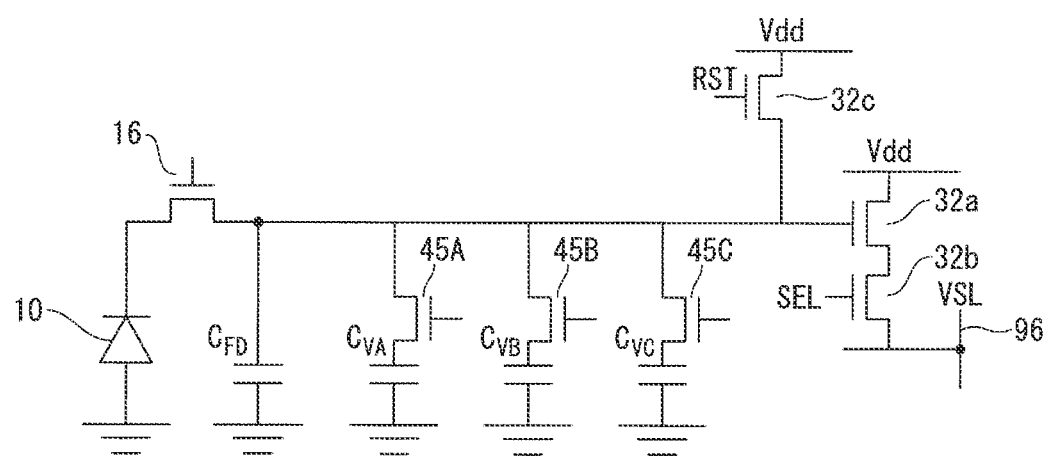
FIG. 30 is a diagram showing an example of an equivalent circuit of a pixel of the solid-state imaging apparatus according to the second modification of the second embodiment of the present disclosure.

FIG. 29 shows a structure that adjusts the effective capacitance $C_{EFF}$ using switching transistors 45A, 45B, and 45C. FIG. 30 shows an equivalent circuit of the solid-state imaging apparatus shown in FIG. 29. The insulating films 42A, 42B, and 42C of the charge holding units 41A, 41B, and 41C have wiring capacitances $C_{VA}$, $C_{VB}$, and $C_{VC}$ that have been differentiated by varying a dielectric material or a film thickness. The charge holding unit 41A is electrically connected by the wiring pattern of the first wiring layer 38A to one of main electrode regions of the switching transistor 45A and electrically connected by a wiring 47 to the other main electrode region. The charge holding unit 41B is electrically connected by the wiring pattern of the second wiring layer 38B to one of main electrode regions of the switching transistor 45B and electrically connected by the wiring 47 to the other main electrode region. The charge holding unit 41C is electrically connected by the wiring pattern of the third wiring layer 38C to one of main electrode regions of the switching transistor 45C and electrically connected by the wiring 47 to the other main electrode region. The wiring 47 is electrically connected to the gate electrode of the pixel transistor 32. By appropriately switching the switching transistors 45A, 45B, and 45C, the effective capacitance $C_{EFF}$ can be adjusted.

Figure 31:
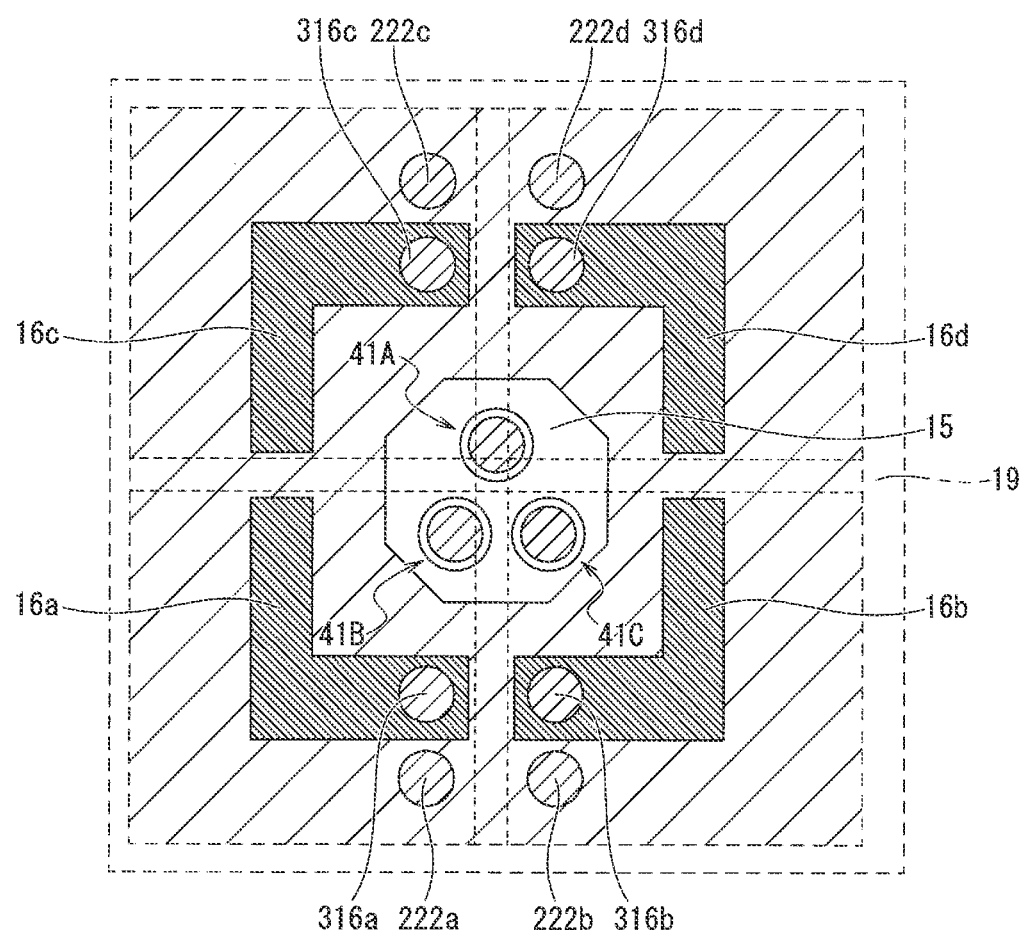
FIG. 31 is a diagram showing an example of a layout of a pixel of the solid-state imaging apparatus according to the second modification of the second embodiment of the present disclosure.

FIG. 31 represents a layout of the first substrate 1 when sharing the charge storage region 15. As shown in FIG. 31, the charge storage region 15 is provided in a central part where four pixels intersect each other. The charge holding units 41A, 41B, and 41C are connected to the charge storage region 15. The first to fourth contact plugs 316a to 316d are respectively connected to the first to fourth transfer gate structures 16a to 16d. Charges transferred to the charge storage region 15 from the first to fourth transfer gate structures 16a to 16d are transferred from the charge storage region 15 to the pixel transistor 32.

While three charge holding units 41A, 41B, and 41C are used in FIGS. 28 and 29, alternatively, two capacitors or four or more capacitors may be used.

(Electronic Device)

Figure 32:
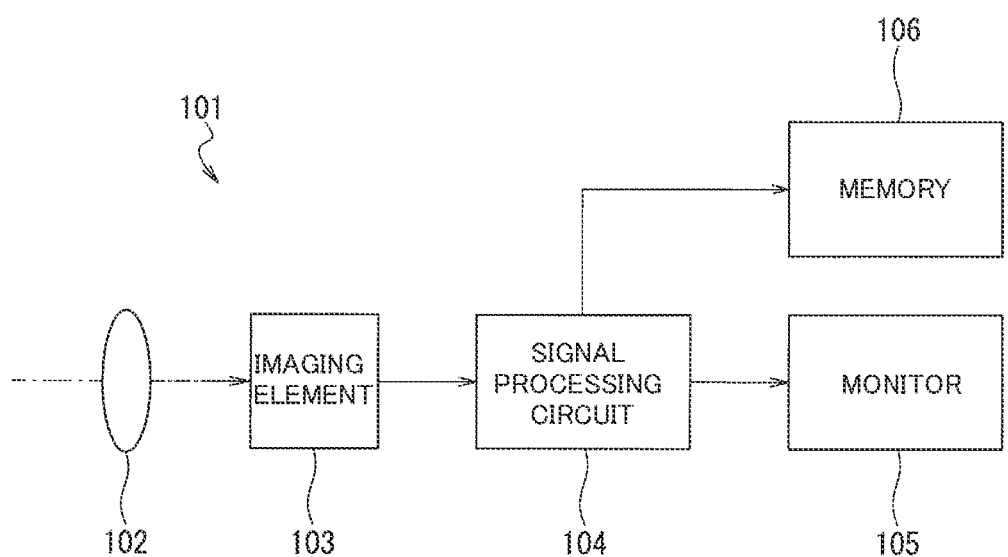
FIG. 32 is a schematic configuration diagram showing an example of an electronic device using the solid-state imaging apparatus according to the first and second embodiments of the present disclosure.

As shown in FIG. 32, an imaging apparatus 101 to be mounted to an electronic device using the solid-state imaging apparatus according to the first and second embodiments of the present disclosure includes an optical system 102, an imaging element 103, a logic circuit 104, a monitor 105, and a memory 106. The imaging apparatus 101 is capable of imaging still images and moving images.

The optical system 102 has one or a plurality of lenses. The optical system 102 guides incident light from a subject to the imaging element 103 and causes an image to be formed on a light-receiving surface of the imaging element 103. As the imaging element 103, the solid-state imaging apparatus according to the first and second embodiments can be used. The imaging element 103 stores charges for a certain period in accordance with an image that is formed on the light-receiving surface via the optical system 102. Signal charges stored in the imaging element 103 are converted into an electric signal. The converted electric signal is output to the logic circuit 104.

The logic circuit 104 performs various kinds of signal processing with respect to the electric signal output from the imaging element 103 and creates image data. The image data created by the logic circuit 104 can be displayed on the monitor 105. In addition, the image data can also be stored in the memory 106.

As described above, using the solid-state imaging apparatus according to the first or second embodiment as the imaging element 103 enables a global shutter function to be realized and sensitivity or a dynamic range can be adjusted by switching conversion efficiencies.

Other Embodiments

While the present disclosure has been described above in the form of the first and second embodiments, it is not to be understood that the descriptions and drawings that constitute parts of the disclosure limit the invention. It is to be understood that various alternative embodiments, examples, and operable techniques will become apparent from the disclosure to those skilled in the art.

While the photoelectric conversion unit 10 has been described using a Si semiconductor in the first and second embodiments, the photoelectric conversion unit is not limited thereto. For example, a composite semiconductor can also be applied as the photoelectric conversion unit. For example, group III-V compound semiconductors such as gallium arsenide (GaAs), aluminum gallium arsenide (AlGaAs), indium gallium arsenide (InGaAs), and indium antimonide (InSb) can be used as a photoelectric conversion unit in an infrared region. In addition, group II-VI compound semiconductors such as mercury cadmium telluride (HgCdTe) can be used as a photoelectric conversion unit in an infrared region. Furthermore, group II-VI compound semiconductors such as cadmium telluride (CdTe) can be used as a photoelectric conversion unit in an X-ray region.

As described above, it is to be understood that the present disclosure includes various embodiments and the like that are not described herein. Therefore, the present disclosure is to be limited solely by matters specifying the invention according to the scope of claims that is reasonable from the disclosure presented above.

The present disclosure can also be configured as follows.

(1)

A photoelectric conversion element, including:
a photoelectric conversion unit configured to convert a light signal into a signal charge;
a transfer gate structure which is connected to the photoelectric conversion unit and which is configured to transfer the signal charge;
a charge storage region to which the signal charge is transferred by the transfer gate structure;
a charge holding unit with a capacitor structure which is electrically connected to the charge storage region and which is configured to store the signal charge; and an amplifying transistor of which a control electrode is electrically connected to the charge storage region, wherein
the photoelectric conversion unit, the transfer gate structure, and the charge storage region are provided on a first substrate,
the amplifying transistor is provided on a second substrate, and
the first substrate and the second substrate are laminated.

(2)

The photoelectric conversion element according to (1) described above, wherein the charge holding unit connected to an input side of the charge storage region is provided on the first substrate.

(3)

The photoelectric conversion element according to (2) described above, wherein the photoelectric conversion unit includes a well region of a first conductivity type and a charge generation region of a second conductivity type configured to form a p-n junction with the well region, and
the charge holding unit includes an embedded capacitance region constituted by a p-n junction provided on a surface on an opposite side to a surface of the well region in contact with the charge generation region, an insulating film provided on a surface of the charge generation region, and an electrode provided on the insulating film.

(4)

The photoelectric conversion element according to (1) described above, wherein the charge holding unit connected to an output side of the charge storage region is provided in a part of an electric path from the first substrate to the second substrate.

(5)

The photoelectric conversion element according to (4) described above, wherein the photoelectric conversion unit includes a well region of a first conductivity type and a charge generation region of a second conductivity type configured to form a p-n junction with the well region,
the charge storage region is provided on a surface on an opposite side to a surface of the well region in contact with the charge generation region, and
the photoelectric conversion element further includes a through connecting conductor which penetrates a bonding interface between the first substrate and the second substrate and which is configured to electrically connect the control electrode of the amplifying transistor and the charge storage region to each other.

(6)

The photoelectric conversion element according to (5) described above, wherein the charge holding unit includes the through connecting conductor, an insulating film provided around the through connecting conductor, and a semiconductor layer of the second substrate which opposes the through connecting conductor via the insulating film.

(7)

The photoelectric conversion element according to (6) described above, wherein the charge holding unit has the through connecting conductor in plurality.

(8)

The photoelectric conversion element according to (7) described above, wherein one or more dielectric materials are provided as the insulating film around each of the plurality of through connecting conductors.

(9)

A solid-state imaging apparatus in which pixels are arranged in plurality, each pixel including:
- a photoelectric conversion unit configured to convert a light signal into a signal charge;
- a transfer gate structure which is connected to the photoelectric conversion unit and which is configured to transfer the signal charge;
- a charge storage region to which the signal charge is transferred by the transfer gate structure;
- a charge holding unit with a capacitor structure which is electrically connected to the charge storage region and which is configured to store the signal charge; and
- an amplifying transistor of which a control electrode is electrically connected to the charge storage region, wherein
- the photoelectric conversion unit, the transfer gate structure, and the charge storage region are provided on a first substrate,
- the amplifying transistor is provided on a second substrate, and
- the first substrate and the second substrate are laminated.

(10)

The solid-state imaging apparatus according to (9) described above, wherein the charge holding unit connected to an input side of the charge storage region is provided on the first substrate.

(11)

The solid-state imaging apparatus according to (10) described above, wherein the photoelectric conversion unit includes a well region of a first conductivity type and a charge generation region of a second conductivity type configured to form a p-n junction with the well region, and
the charge holding unit includes an embedded capacitance region constituted by a p-n junction provided on a surface on an opposite side to a surface of the well region in contact with the charge generation region, an insulating film provided on a surface of the charge generation region, and an electrode provided on the insulating film.

(12)

The solid-state imaging apparatus according to (9) described above, wherein the charge holding unit connected to an output side of the charge storage region is provided in a part of an electric path from the first substrate to the second substrate.

(13)

The solid-state imaging apparatus according to (12) described above, wherein the photoelectric conversion unit includes a well region of a first conductivity type and a charge generation region of a second conductivity type configured to form a p-n junction with the well region,
the charge storage region is provided on a surface on an opposite side to a surface of the well region in contact with the charge generation region, and
the solid-state imaging apparatus further includes a through connecting conductor which penetrates a bonding interface between the first substrate and the second substrate and which is configured to electrically connect the control electrode of the amplifying transistor and the charge storage region to each other.

(14)

The solid-state imaging apparatus according to (13) described above, wherein the charge holding unit includes the through connecting conductor, an insulating film provided around the through connecting conductor, and a semiconductor layer of the second substrate which opposes the through connecting conductor via the insulating film.

(15)

The solid-state imaging apparatus according to any one of (9) to (14) described above, wherein
a third substrate having a logic circuit configured to perform signal processing of an electric signal output from the pixel circuit board is
bonded to the second substrate so as to face a main surface on an opposite side of a main surface that faces the first substrate, and the first substrate, the second substrate, and the third substrate that are electrically connected to each other constitute a three-layer laminated structure.

(16)

An electronic device including a solid-state imaging apparatus in which pixels are arranged in plurality, each pixel including:
- a photoelectric conversion unit configured to convert a light signal into a signal charge;
- a transfer gate structure which is connected to the photoelectric conversion unit and which is configured to transfer the signal charge;
- a charge storage region to which the signal charge is transferred by the transfer gate structure;
- a charge holding unit which is electrically connected to the charge storage region and which is configured to store the signal charge; and
- an amplifying transistor of which a control electrode is electrically connected to the charge storage region, wherein
- the photoelectric conversion unit, the transfer gate structure, and the charge storage region are provided on a first substrate,
- the amplifying transistor is provided on a second substrate, and
- the first substrate and the second substrate are laminated.

REFERENCE SIGNS LIST

1 First substrate
3 Second substrate
5 Third substrate
7 Incidence unit
10 Photoelectric conversion unit (PD)
11, 12 First semiconductor layer
11 Well region
12 Charge generation region
13 Bottom pinning layer
14 Side pinning layer
15 Charge storage region (floating diffusion region)
16 Transfer gate structure
17 Vertical gate
18 Planarizing film 19 Pixel separating unit
20, 35, 37, 55, 57 Interlayer insulating film
21, 43 Through connecting conductor (through via plug)
22 Well contact region
23, 41 Charge holding unit
24 Embedded capacitance region
31 Second semiconductor layer
32 Pixel transistor
32a Amplifying transistor
33a, 53a First main electrode region (source region)
33b, 53b Second main electrode region (drain region)
34, 54, Control electrode (gate electrode)
36, 56 Connecting conductor (contact plug)
38a, 38A, 58a First wiring layer
38b, 38B, 58b Second wiring layer
38c, 38C, 58c Third wiring layer
38d Fourth wiring layer
39, 59 Via plug
42 Insulating film
51 Third semiconductor layer
52 Logic circuit transistor
71 Color filter
72 Microlens
91 Pixel array unit
92 Pixel
93 Driving unit
94 Column processing unit
95 Horizontal driving unit
96 Vertical signal line
97 Vertical driving unit
98 Control line
99 Signal processing unit
101 Imaging apparatus
102 Optical system
103 Imaging element
104 Logic circuit
105 Monitor
106 Memory
230 Capacitor insulating film
231 Capacitor electrode
$C_{FD}$ Diffusion layer capacitance
$C_V$ Wiring capacitance

The invention claimed is:

1. A photoelectric conversion element, comprising:
a photoelectric conversion unit configured to convert a light signal into a signal charge, wherein the photoelectric conversion unit includes:
  a well region of a first conductivity type; and
  a charge generation region of a second conductivity type, wherein the charge generation region is configured to form a p-n junction with the well region;
a transfer gate structure connected to the photoelectric conversion unit, wherein the transfer gate structure is configured to transfer the signal charge;
a charge storage region to which the signal charge is transferred by the transfer gate structure, wherein
  the charge storage region is on a first surface on an opposite side to a second surface of the well region in contact with the charge generation region;
a charge holding unit, with a capacitor structure, electrically connected to the charge storage region, wherein
  the charge holding unit is connected to an output side of the charge storage region,
  the charge holding unit is in a part of an electric path from a first substrate to a second substrate, and
  the charge holding unit with the capacitor structure is configured to store the signal charge;
an amplifying transistor including a control electrode electrically connected to the charge storage region, wherein
  the photoelectric conversion unit, the transfer gate structure, and the charge storage region are on the first substrate,
  the amplifying transistor is on the second substrate, and
  the first substrate and the second substrate are laminated; and
a through connecting conductor which penetrates a bonding interface between the first substrate and the second substrate, wherein
  the through connecting conductor is configured to electrically connect the control electrode of the amplifying transistor and the charge storage region.

2. The photoelectric conversion element according to claim 1, wherein the charge holding unit includes:
the through connecting conductor;
an insulating film around the through connecting conductor; and
a semiconductor layer of the second substrate which opposes the through connecting conductor via the insulating film.

3. The photoelectric conversion element according to claim 2, wherein
the charge holding unit includes a plurality of through connecting conductors, and
the plurality of through connecting conductors comprises the through connecting conductor.

4. The photoelectric conversion element according to claim 3, wherein the insulating film, comprising one or more dielectric materials, is around each of the plurality of through connecting conductors.

5. A solid-state imaging apparatus, comprising:
a plurality of pixels, wherein each pixel of the plurality of pixels comprises:
  a photoelectric conversion unit configured to convert a light signal into a signal charge, wherein the photoelectric conversion unit includes:
    a well region of a first conductivity type; and
    a charge generation region of a second conductivity type, wherein the charge generation region is configured to form a p-n junction with the well region;
  a transfer gate structure connected to the photoelectric conversion unit, wherein the transfer gate structure s configured to transfer the signal charge;
  a charge storage region to which the signal charge is transferred by the transfer gate structure, wherein
    the charge storage region is on a first surface on an opposite side to a second surface of the well region in contact with the charge generation region;
  a charge holding unit, with a capacitor structure, electrically connected to the charge storage region, wherein
    the charge holding unit is connected to an output side of the charge storage region,
    the charge holding unit is in a part of an electric path from a first substrate to a second substrate, and
    the charge holding unit with the capacitor structure is configured to store the signal charge;
  an amplifying transistor including a control electrode electrically connected to the charge storage region, wherein the photoelectric conversion unit, the transfer gate structure, and the charge storage region are on the first substrate, the amplifying transistor is on the second substrate, and the first substrate and the second substrate are laminated; and a through connecting conductor which penetrates a bonding interface between the first substrate and the second substrate, wherein the through connecting conductor is configured to electrically connect the control electrode of the amplifying transistor and the charge storage region.

6. The solid-state imaging apparatus according to claim 5, wherein each pixel of the plurality of pixels further comprises:

a third substrate including a logic circuit configured to perform a signal processing operation of an electric signal output from the second substrate, wherein the third substrate is bonded to the second substrate so as to face a first main surface of the second substrate on an opposite side of a second main surface that faces the first substrate, and the first substrate, the second substrate, and the third substrate are electrically connected to constitute a three-layer laminated structure.

7. The solid-state imaging apparatus according to claim 5, wherein the charge holding unit includes;

the through connecting conductor;

an insulating film around the through connecting conductor; and a semiconductor layer of the second substrate which opposes the through connecting conductor via the insulating film.

8. An electronic device, comprising:

a solid-state imaging apparatus comprising a plurality of pixels, wherein each pixel of the plurality of pixels comprises:

a photoelectric conversion unit configured to convert a light signal into a signal charge, wherein the photoelectric conversion unit includes:

a well region of a first conductivity type; and a charge generation region of a second conductivity type, wherein the charge generation region is configured to form a p-n junction with the well region;

a transfer gate structure connected to the photoelectric conversion unit, wherein the transfer gate structure s configured to transfer the signal charge;

a charge storage region to which the signal charge is transferred by the transfer gate structure, wherein the charge storage region is on a first surface on an opposite side to a second surface of the well region in contact with the charge generation region;

a charge holding unit, with a capacitor structure, electrically connected to the charge storage region, wherein the charge holding unit is connected to an output side of the charge storage region, the charge holding unit is in a part of an electric path from a first substrate to a second substrate, and the charge holding unit with the capacitor structure is configured to store the signal charge;

an amplifying transistor including a control electrode electrically connected to the charge storage region, wherein the photoelectric conversion unit, the transfer gate structure, and the charge storage region are on the first substrate, the amplifying transistor is on the second substrate, and the first substrate and the second substrate are laminated; and a through connecting conductor which penetrates a bonding interface between the first substrate and the second substrate, wherein the through connecting conductor is configured to electrically connect the control electrode of the amplifying transistor and the charge storage region.

* * * * *